United States Patent
Zhao et al.

(10) Patent No.: US 10,727,853 B1
(45) Date of Patent: Jul. 28, 2020

(54) DAC CALIBRATION USING VCO ADC

(71) Applicant: Analog Devices International Unlimited Company, Limerick (IE)

(72) Inventors: Jialin Zhao, Beijing (CN); Matthew Louis Courcy, Freemont, NH (US); Wenhua W. Yang, Lexington, MA (US); Gerard E. Taylor, Laguna Niguel, CA (US)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/433,733

(22) Filed: Jun. 6, 2019

(51) Int. Cl.
*H03M 1/10* (2006.01)
*H03M 1/12* (2006.01)
*H03M 1/38* (2006.01)

(52) U.S. Cl.
CPC ....... *H03M 1/1038* (2013.01); *H03M 1/1071* (2013.01); *H03M 1/124* (2013.01); *H03M 1/38* (2013.01)

(58) Field of Classification Search
CPC .. H03M 1/1038; H03M 1/1071; H03M 1/124; H03M 1/38
USPC .......... 341/118, 120, 143, 144, 155
See application file for complete search history.

(56) References Cited

U.S. PATENT DOCUMENTS

| | | | |
|---|---|---|---|
| 8,542,138 B2 * | 9/2013 | Galton | H03M 3/388 341/118 |
| 8,760,331 B2 * | 6/2014 | Kaald | H03M 3/37 341/143 |
| 8,896,475 B2 | 11/2014 | Shibata | |
| 9,432,045 B2 | 8/2016 | Shibata | |
| 9,735,797 B2 | 8/2017 | Zhao et al. | |
| 9,774,344 B2 | 9/2017 | Shibata | |
| 2014/0368366 A1 | 12/2014 | Galton et al. | |

OTHER PUBLICATIONS

Taylor et al., *A Mostly-Digital Variable-Rate Continuous-Time Delta-Sigma Modulator ADC*, IEEE Journal of Solid-State Circuits, vol. 45, No. 12, Dec. 2010, © 2010 IEEE, 13 pages.
Taylor et al., *A Reconfigurable Mostly-Digital Delta-Sigma ADC with a Worst-Case FOM of 160 dB*, IEEE Journal of Solid-State Circuits, vol. 48, No. 4, Apr. 2013, © 2013 IEEE, 13 pages.

(Continued)

*Primary Examiner* — Khai M Nguyen
(74) *Attorney, Agent, or Firm* — Patent Capital Group

(57) ABSTRACT

A DAC has a plurality DAC cells, and timing mismatch among the DAC cells can introduce errors in an output of a DAC. An efficient technique can be implemented to extract the timing error of a DAC cell. The technique involves a mixer to mix the timing error to DC (DC stands for direct current, where signal frequency is zero) and a VCO ADC to observe the output of the DAC cell to measure and extract the timing error. A first measurement is made using a first quadrature phase signal and a second measurement is made using a second quadrature phase signal. A difference between the first measurement and the second measurement yields the timing error of the DAC cell. Advantageously, the mixer can be integrated within a voltage-to-current converter of the VCO ADC. The timing error can be corrected in the digital domain or analog domain.

20 Claims, 13 Drawing Sheets

(56) References Cited

OTHER PUBLICATIONS

Shibata et al., *16.2: A 9GS/s 1GHz-BW Oversampled Continuous-Time Pipeline ADC Achieving—161dBFS/Hz NSD*, ISSCC 2017 / Session 16 / Gigahertz Data Converters / 16.2, © 2017 IEEE International Solid-State Circuits Conference, 3 pages.

Taylor et al., *16.4 A Mostly Digital Variable-Rate Continuous-Time ADC ΔΣ Modulator*, ISSCC 2010 / Session 16 / High-Performance Data Converters / 16.4, © 2010 IEEE International Solid-State Circuits Conference, 3 pages.

Tang et al., *A 14 bit 200 Ms/s DAC with SFDR >78 dBc, IM3 < -83 dBc and NSD <- 163 dBm/Hz Across the Whole Nyquist Band Enabled by Dynamic-Mismatch Mapping*, IEEE Journal of Solid-State Circuits, vol. 46, No. 6, Jun. 2011 © 2011 IEEE, 11 pages.

Taylor et al., *A Reconfigurable Mostly-Digital ΔΣ ADC with a Worst-Case FOM of 160dB*, 2012 Symposium on VLSI Circuits Digest of Technical Papers, 2 pages.

Taylor, *Mostly Digital ADC's for Highly-Scaled CMOS Processes*, Dissertation, 2011, 130 pages.

Yoon et al., *A 0.04-mm2 0.9-mW 71-dB SNDR Distributed Modular ΔΣ ADC with VCO-based Integrator and Digital DAC Calibration*, © 2015 IEEE, 4 pages.

\* cited by examiner

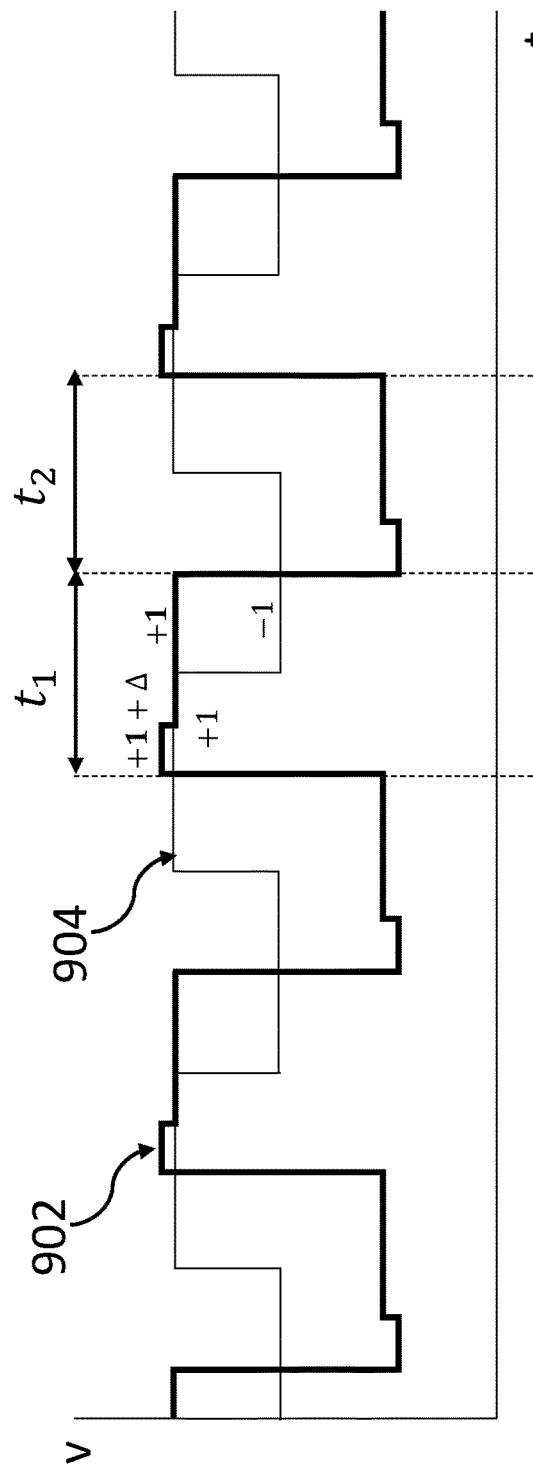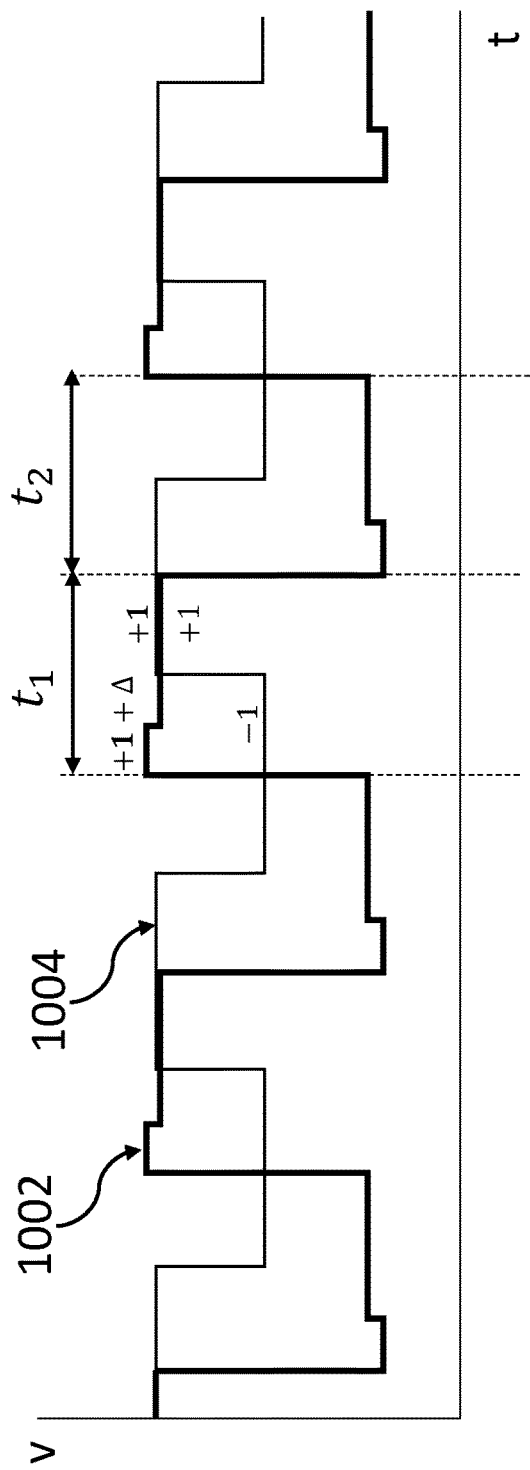

DAC CALIBRATION USING VCO ADC

TECHNICAL FIELD OF THE DISCLOSURE

The present disclosure relates generally to analog-to-digital converters (ADCs) and, more particularly, to calibrating digital-to-analog converter (DAC) timing errors using voltage-controlled-oscillator (VCO) ADCs.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an ADC as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost, and size. As the applications needing ADCs grow, the need for accurate and reliable conversion performance also grows.

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), signal to quantization noise ratio (SQNR), noise spectral density (NSD), total harmonic distortion (THD), total harmonic distortion plus noise (THD+N), and spurious free dynamic range (SFDR). ADCs have many different designs, which can be chosen based on the application requirements and performance specifications.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 9 shows a plot of the signal driving the DAC cell and the first quadrature phase signal used by the mixer, according to some embodiments of the disclosure;

FIG. 10 shows a plot of the signal driving the DAC cell and the second quadrature phase signal used by the mixer, according to some embodiments of the disclosure;

DESCRIPTION OF EXAMPLE EMBODIMENTS OF THE DISCLOSURE

Overview

Figure 1:
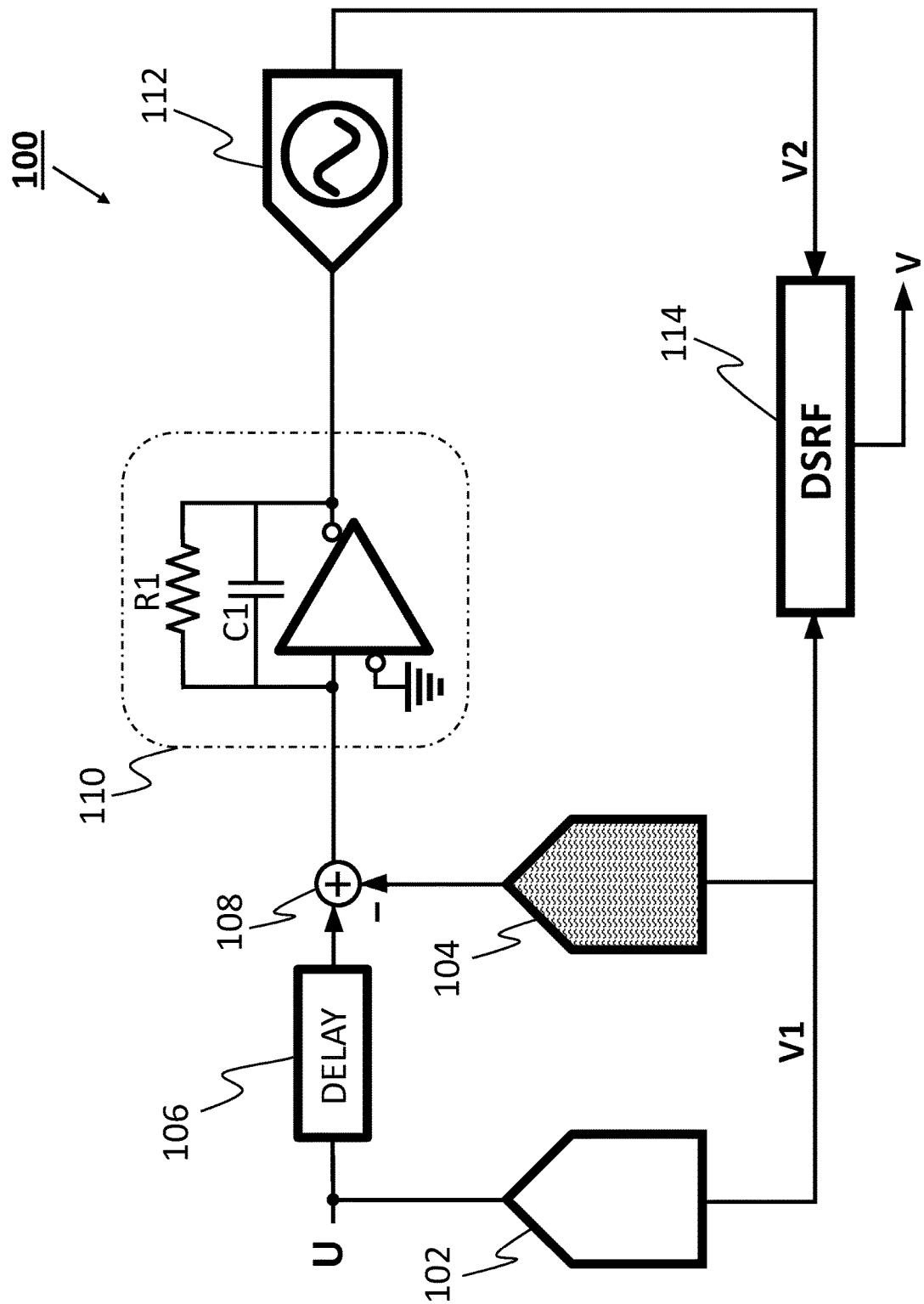
FIG. 1 shows an illustrative system diagram of a VCO-based continuous-time (CT) pipelined ADC having a CT residue generation front end and a CT VCO ADC back end, according to some embodiments of the disclosure.

A DAC has a plurality DAC cells, and timing mismatch among the DAC cells can introduce errors in an output of a DAC. An efficient technique can be implemented to extract the timing error of a DAC cell. The technique involves a mixer to mix the timing error to DC (DC stands for direct current, where signal frequency is zero) and a VCO ADC to observe the output of the DAC cell to measure and extract the timing error. A first measurement is made using a first quadrature phase signal and a second measurement is made using a second quadrature phase signal. A difference between the first measurement and the second measurement yields the timing error of the DAC cell. Advantageously, the mixer can be integrated within a voltage-to-current converter of the VCO ADC. The timing error can be corrected in the digital domain or analog domain.

Effects of DAC Timing Mismatch on ADCs

ADCs have a variety of architectures. In several architectures, a DAC is used to generate an analog signal based on a digital signal generated by the ADC. The DAC can be a part of a feedforward path or as part of a feedback path. For instance, the DAC can generate an analog signal that can be used to form a quantization error of a stage. When the DAC is part of a feedforward path, the quantization error can be further digitized by other stage(s). When the DAC is part of a feedback path, the quantization error can be shaped by a loop. Ideally, the DAC generates a perfect analog signal, which is used by the ADC to carry out analog-to-digital conversion. However, in practice, the DAC has errors in its output, which can degrade the performance of the ADC, if not addressed appropriately.

One example of ADC architectures that has one or more DACs is the pipelined ADC. A pipelined ADC comprises N stages in cascade. For stage-1 to stage-N−1, each stage has a coarse ADC to generate a digital output signal, and residue generation circuitry to generate an amplified residue signal to be processed by the following stage. The residue generation circuitry includes a DAC to generate a reconstructed analog input signal based on the digital output signal of the stage, a node to generate a residue signal (which is a difference between the analog input signal and the reconstructed analog input signal), and an amplifier to generate the amplified residue signal. Stage-N has an ADC, e.g., a flash ADC comprising a bank of comparators, to generate the last digital output signal. In some cases, the pipelined ADC is implemented with CT circuitry, which means that the ADC does not have samplers processing analog signals (e.g., switched-capacitor circuits). Such CT pipelined ADC has the benefit of anti-aliasing and increased bandwidth, when compared against their discrete-time (DT) counterparts. However, CT pipelined ADCs are generally more difficult to design and implement. Other examples of ADC architectures that has one or more DACs include: successive-approximation-register ADCs, delta-sigma ADCs (which has a DAC in its feedback path), and multi-stage noise-shaping ADCs (which has cascaded delta-sigma ADCs).

One variation on the CT pipelined ADC is a VCO-based CT pipelined ADC. The VCO-based CT pipelined ADC implements a VCO ADC (as opposed to a flash ADC) as the last stage of the CT pipelined ADC. FIG. 1 shows an illustrative system diagram of a VCO-based CT pipelined ADC 100 having a CT residue generation front end and a CT VCO ADC back end, according to some embodiments of the disclosure. Specifically, the VCO-based CT pipelined ADC 100 shown as an example has two stages. The first stage generates a residue signal. The residue signal is filtered or amplified by a residue amplifier 110. The second stage quantizes or digitizes the amplified residue signal.

The first stage to generate a residue signal includes: a coarse ADC 102 (e.g., a flash ADC), a DAC 104 (e.g., a current-steering DAC), an analog delay circuit 106, and a subtraction node 108. The ADC 102 quantizes or digitizes an analog input signal U, and generates a first digital signal V1. The analog delay circuit 106 generates a delayed version of the analog input signal U. The DAC 104 generates a reconstructed version of the analog input signal U based on the first digital signal V1. Subtraction node 108 subtracts the delayed version of the analog input signal U by the reconstructed version of the analog input signal U to form a residue signal.

The residue amplifier 110 to amplify the residue signal from subtraction node 108 can implement inter-stage gain. Moreover, the residue amplifier 110 can provide a filtering function, such as low-pass filtering function or band-pass filtering function.

The second stage includes a VCO ADC 112. The VCO ADC is a (mostly-digital) CT ADC. The VCO ADC comprises, in series: a ring oscillator, a phase-to-digital converter, and a differentiator. An analog input signal drives a ring oscillator, and the differentiator outputs a digital signal that is quantized version of the analog input signal. In the example shown, the VCO ADC 112 digitizes or quantizes the amplified residue signal from the residue amplifier 110, and generates a second digital signal V2.

A digital signal reconstruction filter 114 receives the first digital signal V1 and the second digital signal V2. Taking account of the transfer functions of the first stage, the residue amplifier 110, and the second stage, the digital signal reconstruction filter 114 filters and combines the first digital signal V1 and the second digital signal V2 to generate a final digital output V.

Non-linearities of the DAC 104 in VCO-based CT pipelined ADC 100 can introduce harmonic distortion and degrade the performance of the VCO-based CT pipelined ADC 100. The non-linearities can include static mismatch, timing error, and switching error (e.g., duty cycle error). The non-linearities of a DAC within other ADC architectures can also be problematic. The following passages describe the timing error in greater detail.

A DAC, such as the DAC 104 in FIG. 1, comprises a plurality of DAC cells. The DAC cells are driven by respective data signals. A high-speed DAC is typically implemented as a current-steering DAC. The DAC cells of a current-steering DAC steer currents in response to the respective data signals. For instance, the DAC can receive an input word, and bits of the input word drive and control respective DAC cells. A bit of the input word can steer current in one of two directions. The current outputs of the DAC cells are combined to form an analog output signal of the DAC. The net, aggregate amount of current steered by the DAC cells would correspond to the value of the input word. The DAC can be thermometer-coded, or binary-coded. For a thermometer-coded DAC, the DAC cells are controlled by respective bits of a thermometer-coded input word. The DAC cells of a thermometer-coded DAC ideally deliver the same amount or current or charge towards the output of the DAC. In practice, the amount of current or charge being delivered by the DAC cells are not matched. For instance, timing error is introduced by timing skew difference between DAC cells. The timing skew difference is primarily due to clock path mismatches and asymmetries. The result of timing skew difference means that two DAC cells can deliver different amount of charge at a given time due to different clock timing.

Figure 2:
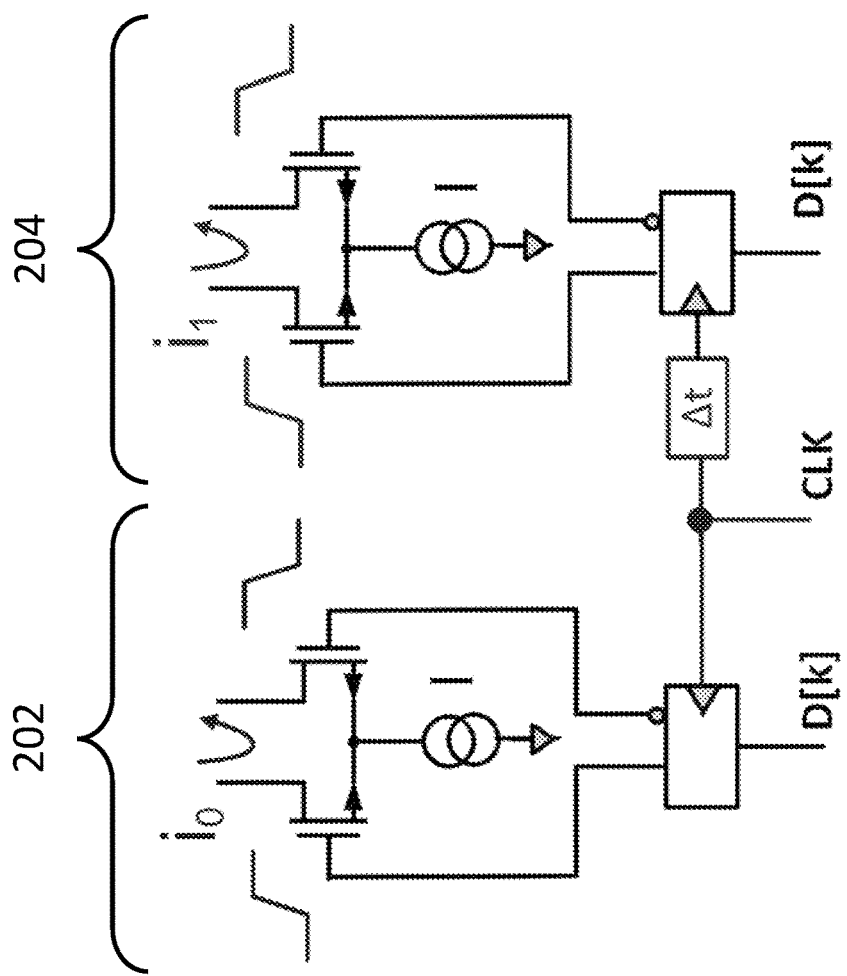
FIG. 2 shows two DAC cells, according to some embodiments of the disclosure.

FIG. 2 shows a first DAC cell 202, and a second DAC cell 204, according to some embodiments of the disclosure. The first DAC cell 202 and the second DAC cell 204 are current-steering DAC cells. The first DAC cell 202 and the second DAC cell 204 have timing path difference or timing skew difference, which is represented by Δt. The first DAC cell 202 and the second DAC cell 204 each has a current source (denoted as "I" in the FIGURE) and a pair of switches (shown as transistors) coupled to the current source for steering the current. The pairs of switches are controlled by respective data signals, i.e., respective bits of the input word D[k], to steer the current. A given data signal for a pair of switches in a DAC cell can steer the current from the current source through one of the switches. Current output of the first DAC cell 202 is represented by i0. Current output of the second DAC cell is represented by i1. The data signal is clocked by clock signal CLK. The timing skew Δt between first DAC cell 202 and the second DAC cell 204, are introduced mainly by clock path mismatches and asymmetries, i.e., the CLK signal experiences different latencies as they arrive at the first DAC cell 202 and the second DAC cell 204. As a result, the charge or current being delivered to the respective outputs of the DAC cells, shown as i0 and i1 for the first DAC cell 202 and the second DAC cell 204 respectively, are mismatched due to the timing skew of the clock signal CLK arriving at the DAC cells.

Figure 3:
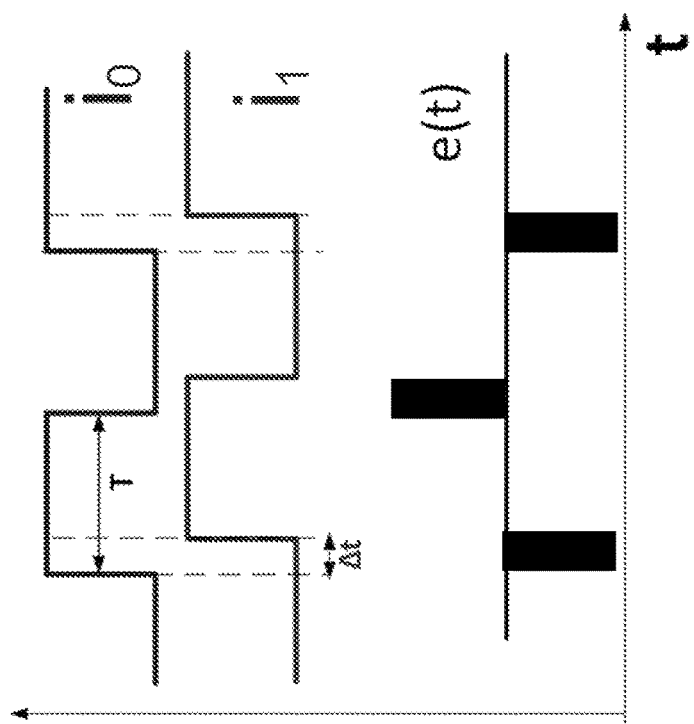
FIG. 3 illustrates error charges delivered due to timing skew of the two DAC cells in FIG. 2, according to some embodiments of the disclosure.

FIG. 3 illustrates error charges delivered due to timing skew difference of the two DAC cells in FIG. 2, according to some embodiments of the disclosure. Different DAC cells can deliver different charges at a given time due to different clock timing. For the first DAC cell 202 and the second DAC cell 204 in FIG. 2, the timing skew difference in the clock signals results in non-ideal currents at the outputs, shown as i0 and i1 for the first DAC cell 202 and the second DAC cell 204 respectively. The error charge e(t) appears due to the non-ideal output currents, i0 and i1, when the changes in the respective current outputs are not aligned in time.

When there is a timing skew difference, the total delivered charge by the DAC (having DAC cells such as the first DAC cell 202 and the second DAC cell 204) would be signal dependent. Therefore, the timing skew difference introduces harmonic distortions at the output of the DAC. The timing mismatch among DAC cells becomes more significant for high bandwidth, high-speed ADCs, since the errors created from timing mismatch is a bigger portion of the entire charge in one clock cycle as the clock gets faster. Also, dynamic errors of the DAC can dominate the overall linearity of the ADC in which the DAC is located. Due to timing mismatch error, the signal-to-noise-and-distortion ratio (SNDR) and spurious free dynamic range (SFDR) performances of the ADCs can be greatly deteriorated.

Timing Error Measurement Using Known Signals and their Quadrature Phase Counterparts One way to measure the timing error is to exercise a DAC cell using a known signal to expose the timing error. The output of the DAC cell can then be mixed by a quadrature phase counterpart of the known signal such that the timing error in the output is down converted to DC (DC stands for direct current, where signal frequency is zero). The quadrature phase counterpart can be 90° out of phase with the known signal. A VCO ADC, which has infinite DC gain, can be used as an observer ADC to measure the timing error. The infinite DC gain makes the VCO ADC an accurate DC meter. The VCO ADC can digitize the result from the mixer, and store a digital output.

Since the digital output would have a component due to the timing error and a DC component, the measurement is repeated for the same DAC cell using a different quadrature phase counterpart. The different quadrature phase counterpart can be 270° out of phase with a known signal that is driving the DAC cell. Subtracting one measurement by the other measurement removes the DC component, leaving only the component due to the timing error.

Advantageously, the timing error, obtained based on the two-measurement scheme is mixed down to DC and observed by the VCO ADC (an accurate DC meter), can be extracted efficiently using an averaging operation. Averaging can be implemented efficiently in hardware. In other words, the averaging operation can obtain the timing error from the two measurements, and the timing error measurement scheme does not require any complex frequency domain transformations on the two measurements to extract the timing error. Additionally, the VCO ADC is a mostly-digital ADC, which means that the VCO ADC has a very small footprint in smaller process nodes (e.g., 28 nm, 16 nm, etc.) and can scale with process nodes.

The two measurements can be performed for a plurality of DAC cells of a DAC to obtain timing errors for respective DAC cells. The obtained timing errors for the respective DAC cells can be stored in readable-storage such as a table. For example, a calibration engine can use the obtained timing errors to compute correction coefficients to correct the timing errors. The timing errors can be reduced or corrected in the digital domain (e.g., by applying a correction to a digital output), or in the analog domain (e.g., by tuning analog circuitry in the DAC).

The circuitry to support the measurement scheme includes a multiplexer to select appropriate signals to drive the DAC cells, e.g., selecting the known signal or a data signal to drive a given DAC cell. The circuitry also includes an embedded mixer that is in the signal path between the DAC output and a ring oscillator of a VCO ADC. The mixer can be a passive mixer that is embedded/integrated in a voltage-to-current (V/I) converter of the VCO ADC. The circuitry also includes a quadrature phase signal generator to generate the known signals driving a given DAC cell and the quadrature phase counterparts. The circuitry can include a multiplexer to select a quadrature phase counterpart to drive the mixer for making a given measurement.

Two types of known signals can be used to measure timing errors. FIGS. 4-10 illustrate a scheme that is based on square waves at a fixed frequency. FIGS. 11-17 illustrate a scheme that is based on (pseudo-)random signals.

Note that DAC is taken offline during error measurement. The schemes described herein operate in the foreground.

When provided with the circuitry to make the two measurements and a VCO ADC to act as an observer ADC, it is possible to efficiently and effectively measure timing errors of a DAC within a CT ADC. Examples of CT ADCs can include: successive-approximation-register ADCs, delta-sigma ADCs (which has a DAC in its feedback path), pipelined ADCs, and multi-stage noise-shaping ADCs (which has cascaded delta-sigma ADCs). In some cases, the scheme to measure timing errors can be used to measure timing errors of a stand-alone DAC with an observer VCO ADC.

The scheme of making two measurements using the same DAC cell does not require the use of a reference cell to extract a timing error of the DAC cell. Additionally, complex circuitry (e.g., an on-chip Fast Fourier Transform engine) would be needed to measure the timing error, because the timing error is in the form of tone, and complex circuitry is needed to extract the power of the tone associated with the timing error. The complex circuitry can take up a significant amount of area, consume more power, and require longer measurement time.

Timing Error Measurement Using Square Waves

One type of known signal that can be used to extract a timing error of a DAC cell is square waves at a fixed frequency. For a first measurement being made during a first period (of time), the DAC cell is driven by a square wave with a fixed frequency and a mixer in the signal path mixes the signal using a first quadrature phase signal, e.g., a square wave that is 90° out of phase with respect to the square wave driving the DAC cell. For a second measurement being made during a second period (of time), the DAC cell is driven by the square wave with the fixed frequency and the mixer in the signal path mixes the signal using a second quadrature phase signal, e.g., a square wave that is 270° out of phase with respect to the square wave driving the DAC cell. The first period and the second period can have the same duration.

Figure 4:
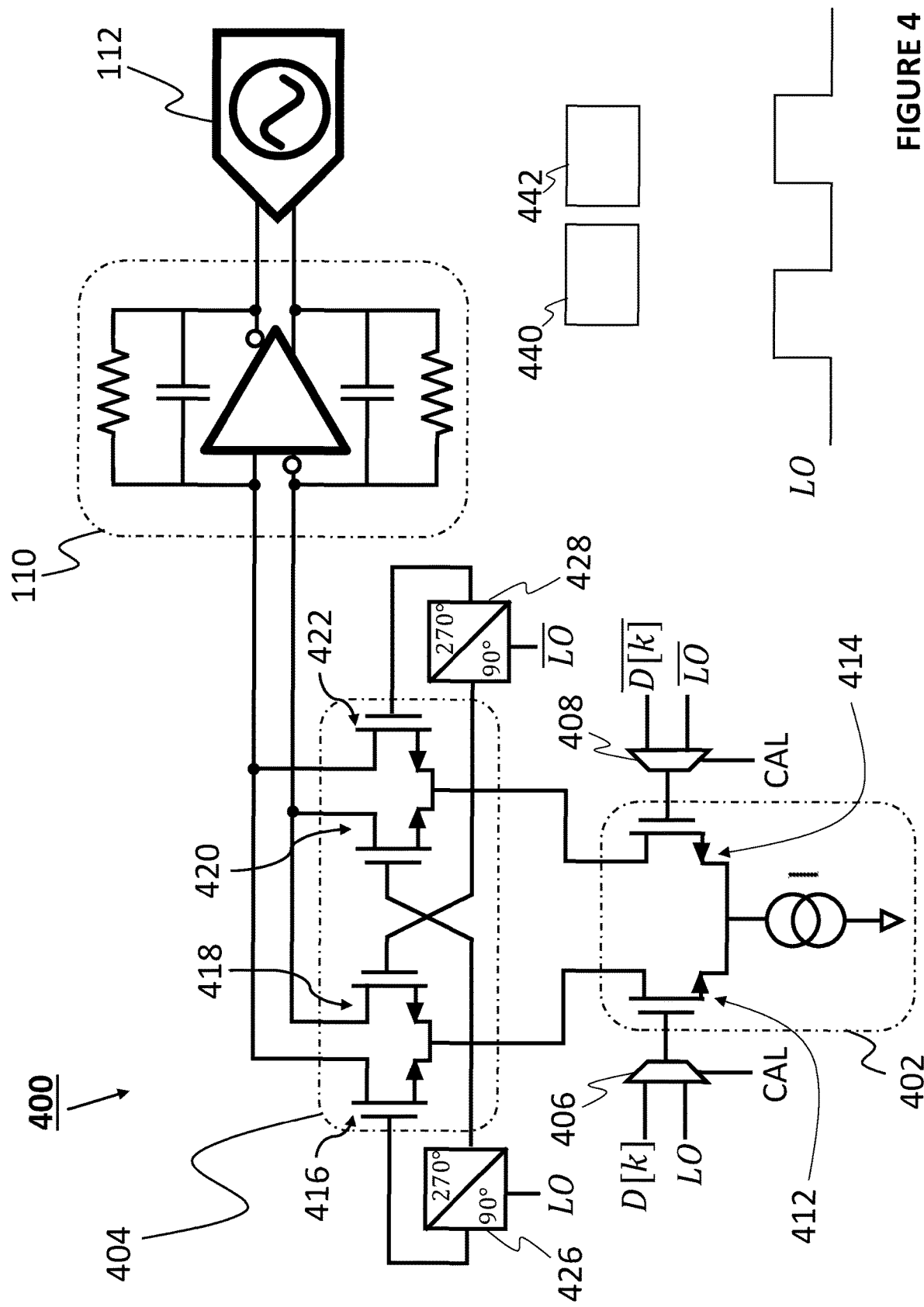
FIG. 4 shows a DAC cell, a mixer, and a VCO ADC to measure timing error of the DAC cell, using square wave, according to some embodiments of the disclosure.

FIG. 4 shows a DAC cell 402, a mixer 404, and a VCO ADC 112 to measure timing error of the DAC cell 402, using square wave with a fixed frequency, according to some embodiments of the disclosure. The DAC cell 402 is part of a DAC comprising a plurality of DAC cells (other DAC cells are not shown for simplicity). Similar to the DAC cells illustrated in FIG. 2, the DAC cell 402 is a current-steering DAC cell. The DAC cell 402 has a current source (denoted as "I" in the FIGURE) and a pair of current-steering switches coupled to the current source for steering the current. The pair of current-steering switches are shown as transistor 412 and transistor 414. The transistor 412 and transistor 414 are controlled by signals at the gates of transistor 412 and transistor 414.

Downstream of the DAC cell 402 is a mixer 404 shown to illustrate a mixing function that occurs during the two measurements. Mixer 404 is a passive mixer, sometimes referred to as the Gilbert mixer. Mixer 404 has two pairs of transistors, i.e., four transistors total. A first pair of transistors, i.e., transistor 416 and transistor 418, are coupled to and downstream of the transistor 412. A second pair of transistors, i.e., transistor 420 and transistor 422, are coupled to and downstream of the transistor 412. The mixer 404 is a current mixer that mixes a current output of the DAC cell 402.

Also shown in FIG. 4 is residue amplifier 110, which can be part of the signal chain, e.g., if the DAC is part of a pipelined ADC. The residue amplifier 110 can be a transimpedance amplifier that converts a current output of the mixer 404 into a voltage signal.

Also in the signal chain is a VCO ADC 112 acting as an observer ADC. The VCO ADC 112 quantizes and observes an output of the DAC (including the DAC cell) to measure the timing error of the DAC cell 402. In some cases, the VCO ADC 112 can be part of a stage in a pipelined ADC following the stage in which the DAC is located. The VCO ADC 112 can receive the voltage signal from the residue amplifier 110 as input.

During normal operation, i.e., not during calibration, transistor 412 and transistor 414 are to be driven or controlled by respective data signals, i.e., an input bit D[k] and inverted input bit $\overline{D[k]}$ respectively. Specifically, transistor 412 and transistor 414 are to be driven or controlled by respective data signals, i.e., an input bit D[k] and inverted input bit $\overline{D[k]}$ respectively, to steer the current from the current source. The input bit D[k] and inverted input bit $\overline{D[k]}$ can steer the current from the current source through one of the transistors (when one transistor is conducting current and the other transistor is not conducting current). During calibration, transistor 412 and transistor 414 are to be driven or controlled by a known signal, i.e., a first known signal LO and an inverted version of the first known signal $\overline{LO}$ respectively. A multiplexer, e.g., mux 406 and mux 408, can select and provide, based on a calibration signal (e.g., shown as CAL in the FIGURE), the first known signal (LO and $\overline{LO}$) or a data signal (D[k] and $\overline{D[k]}$) to the DAC cell 402. For instance, the multiplexer can provide the first known signal (LO and $\overline{LO}$) to drive the DAC cell 402 during the first period and the second period.

To make the first measurement, during the first period, the DAC cell 402 is driven by the first known signal (LO and $\overline{LO}$), and the mixer 404 is driven by a first quadrature phase signal ($LO_{90°}$ and $\overline{LO_{90°}}$). Specifically, the first quadrature phase signal is 90° out of phase with respect to the first known signal. Accordingly, the mixer mixes the output of the DAC cell 402 using the first quadrature phase signal during the first period. For instance, the first pair of transistors of the mixer 404, i.e., transistor 416 and transistor 418, can be driven by $LO_{90°}$ and its inverted counterpart $\overline{LO_{90°}}$ respectively. Also, the second pair of transistors of the mixer 404, i.e., transistor 420 and transistor 422, can be driven by $LO_{90°}$ and its inverted counterpart $\overline{LO_{90°}}$ respectively.

To make the second measurement, during the second period, the DAC cell 402 is driven by the first known signal (LO and $\overline{LO}$), and the mixer 404 is driven by a second quadrature phase signal ($LO_{270°}$ and $\overline{LO_{270°}}$). Specifically, the second quadrature phase signal is 270° out of phase with respect to the first known signal (LO and $\overline{LO}$). Accordingly, the mixer mixes the output of the DAC cell 402 using the second quadrature phase signal ($LO_{270°}$ and $\overline{LO_{270°}}$) during the second period. For instance, the first pair of transistors of the mixer 404, i.e., transistor 416 and transistor 418, can be driven by $LO_{270°}$ and its inverted counterpart $\overline{LO_{270°}}$ respectively. Also, the second pair of transistors of the mixer 404, i.e., transistor 420 and transistor 422, can be driven by $LO_{270°}$ and its inverted counterpart $\overline{LO_{270°}}$ respectively.

A quadrature signal generator, e.g., quadrature signal generator 426 and quadrature signal generator 428, can be implemented to generate the first known signal (LO and $\overline{LO}$), first quadrature phase signal ($LO_{90°}$ and $\overline{LO_{90°}}$), and the second quadrature phase signal ($LO_{270°}$ and $\overline{LO_{270°}}$). The first known signal, the first quadrature phase signal, and the second quadrature phase signal, have the same fixed frequency. Exemplary circuitry for a quadrature signal generator is shown in FIG. 5.

A non-transitory storage medium 440 (e.g., memory) can be included to store digital output of the VCO ADC 112, e.g., a first digital output generated by the VCO ADC 112 during the first period, and a second digital output generated by the VCO ADC 112 during a second period. The digital output can be used for extracting the timing error of the DAC cell 402. Processing circuitry 442 can be included to perform such processing, including extracting a timing error of the DAC cell 402 based on digital output of the VCO ADC generated during the first period and the second period. The processing circuitry 442 can include one or more of: specialized digital circuitry/hardware to perform the processing, and a (micro)processor that can execute instructions to perform the processing.

Figure 5:
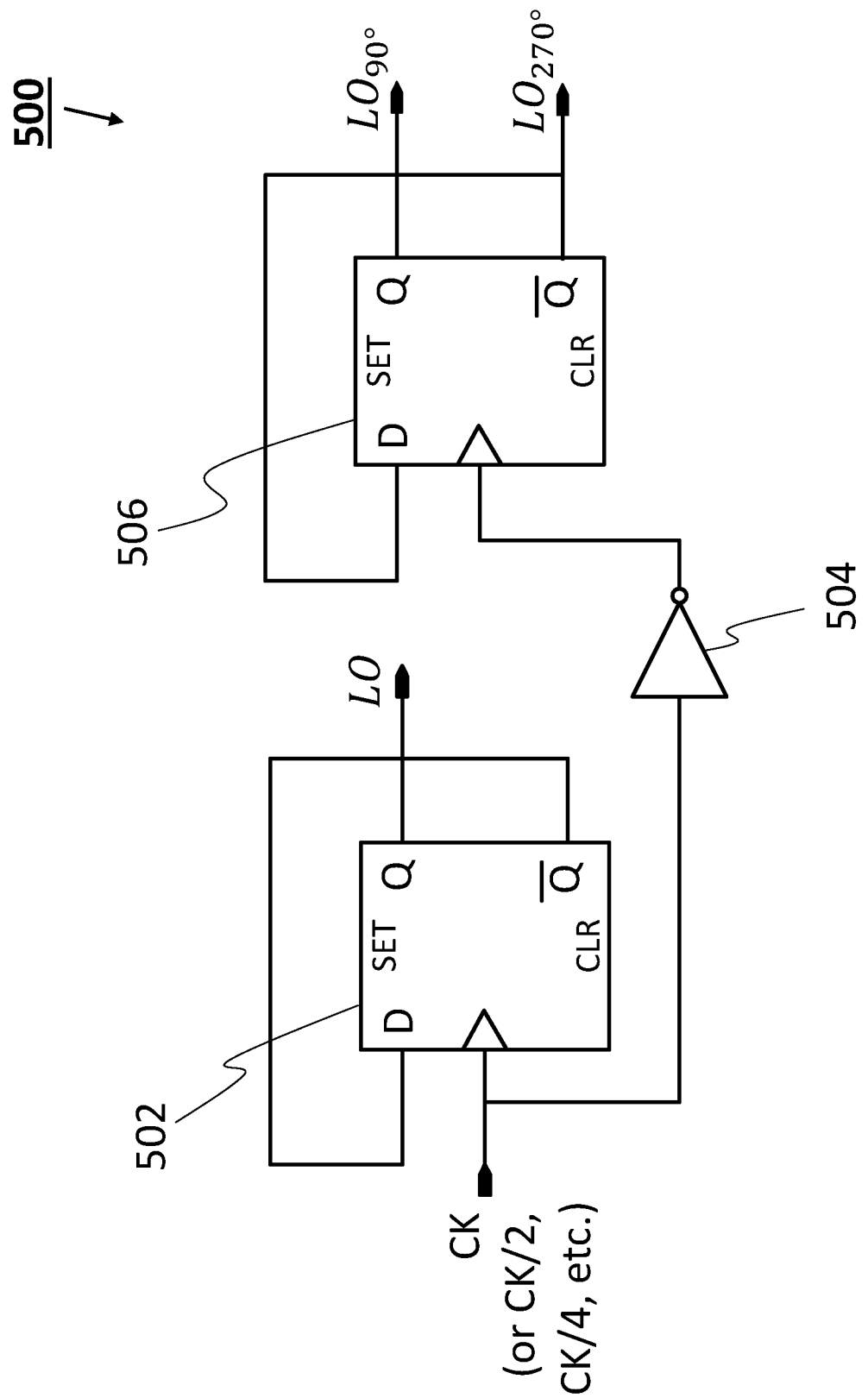
FIG. 5 shows an exemplary quadrature phase signal generator, according to some embodiments of the disclosure.

FIG. 5 shows an exemplary quadrature phase signal generator 500, according to some embodiments of the disclosure. The quadrature phase signal generator 500 can use a master clock signal CK to generate the first known signal (LO and $\overline{LO}$), first quadrature phase signal ($LO_{90°}$ and $\overline{LO_{90°}}$), and the second quadrature phase signal ($LO_{270°}$ and $\overline{LO_{270°}}$). In some alternative embodiments, the quadrature phase signal generator 500 can use a divided down clock, such as CK/2 (master clock signal CK divided by 2), CK/4 (master clock signal CK divided by 4), etc.

The quadrature phase signal generator 500 comprises a plurality of data flip-flops (D flip-flops) to generate the first known signal, the first quadrature phase signal, and the second quadrature phase signal. A D flip-flop captures a value of a signal at the data input D (e.g., at a rising edge of a clock signal clocking the D flip-flop), and outputs the captured value at the output Q of the D flip-flop (and an inverted value at the inverted output $\overline{Q}$ of D flip-flop). The output Q of the D flip-flop (and the inverted output $\overline{Q}$) does not change otherwise. The D flip-flop acts as a memory cell or a delay line.

In the example shown, the quadrature phase signal generator 500 comprises a first D flip-flop 502 and a second D flip-flop 506. The first D flip-flop 502 receives and is clocked by, e.g., the master clock signal CK. The first D flip-flop 502 receives an inverted output $\overline{Q}$ of the first D flip-flop 502 at the data input D of the first D flip-flop 502. The first D flip-flop 502 generates the first known signal LO at the output Q of the first D flip-flop 502. Note that the inverted version of the first known signal $\overline{LO}$ is also generated and is available at the inverted output Q of the first D flip-flop 502. The second D flip-flop 506 receives and is clocked by an inverted clock signal generated by an inverter 504. The inverted clock signal is an inverted version of the clock signal driving the first D flip-flop 502. The inverter 504 receives and inverts, e.g., the master clock signal CK. The second D flip-flop 506 receives an inverted output $\overline{Q}$ of the second D flip-flop 506. The second D flip-flop 506 generates the first quadrature phase signal $LO_{90°}$ at an output Q of the second D flip-flop 506. Additionally, the second quadrature phase signal $LO_{270°}$ is generated and is available at the inverted output $\overline{Q}$ of the second D flip-flop 506. Note that the inverted version of the first quadrature phase signal $\overline{LO_{90°}}$ is also generated and is available at the inverted output $\overline{Q}$ of the second D flip-flop 506. Moreover, the inverted version of the second quadrature phase signal $\overline{LO_{270°}}$ is also generated and is available at the output Q of the second D flip-flop 506.

Figure 6:
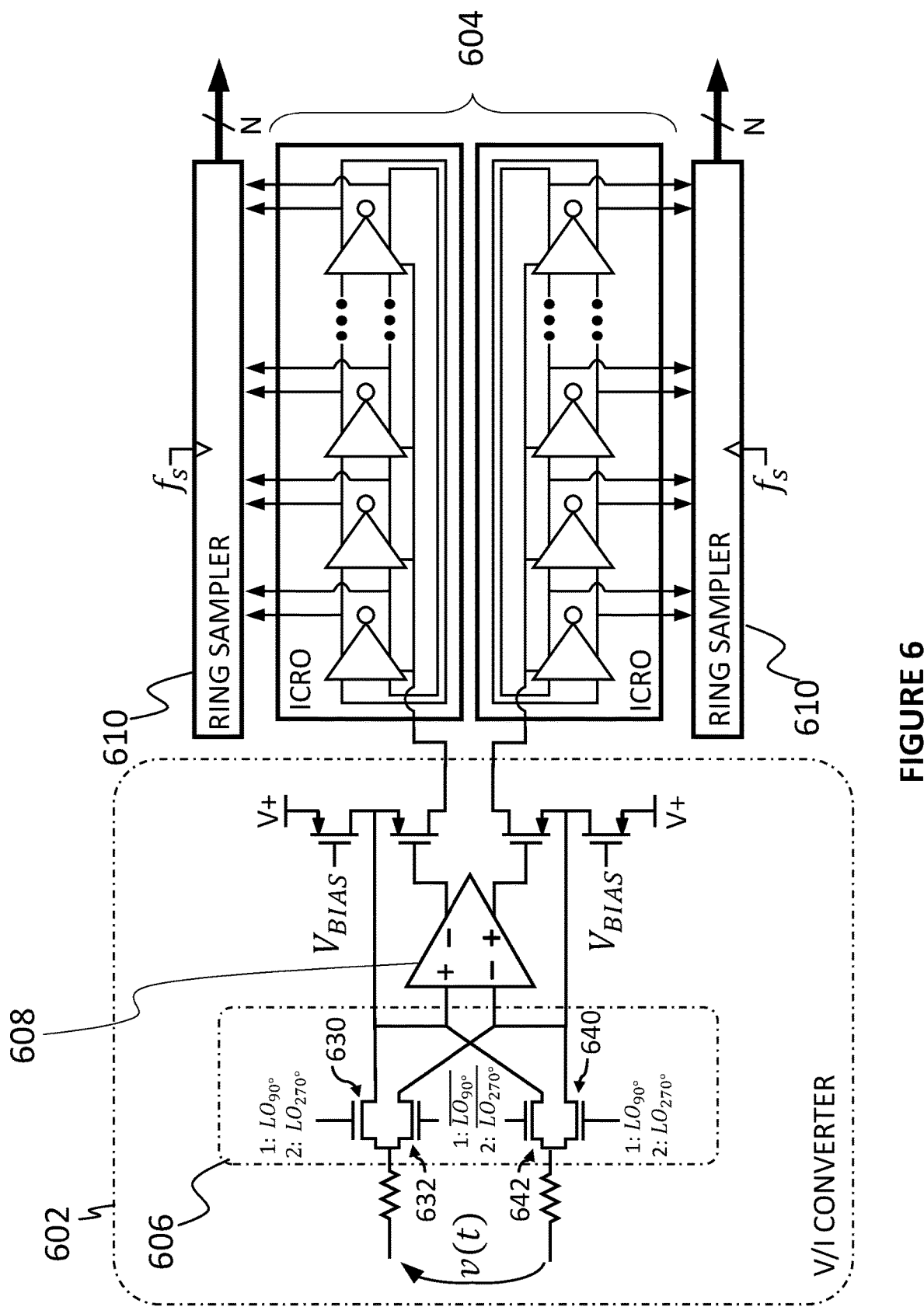
FIG. 6 shows a VCO ADC comprising a voltage-to-current converter, current-controlled-ring-oscillator, and ring sampler, according to some embodiments of the disclosure.

Referring back to FIG. 4, the mixer 404 is shown to illustrate a mixer in the signal path, and in practice, the mixer 404 can be embedded within the VCO ADC 112, specifically, within a V/I amplifier of the VCO ADC 112. Embedding the mixer within the VCO ADC 112 avoids the need to modify the DAC circuits and architecture. FIG. 6 shows a VCO ADC comprising a V/I converter 602, current-controlled-ring-oscillator (ICRO) 604, and ring sampler 610, according to some embodiments of the disclosure. The V/I converter 602 receives a voltage signal from, e.g., residue amplifier 110 of FIG. 4, as input, and converts the voltage signal into a current signal. The current signal from the V/I converter 602 drives the ICRO 604. The ICRO 604 comprises a ring of current-starved inverters (odd number of inverters). The ring sampler 610 can sample the outputs of the inverters in the ICRO 604 to obtain phase information of the input to the VCO ADC 112. The phase information is used to output a digital output signal representative of the input to the VCO ADC 112.

Advantageously, the V/I converter 602 is modified to include an embedded mixer 606. The embedded mixer 606 is in the signal path between the output of the DAC cell (e.g., DAC cell 402 of FIG. 4), and the ICRO 604. The embedded mixer 606 provides the mixing functions previously described with the mixer 404 in FIG. 4, but the embedded mixer 606 is incorporated within the V/I converter 602 of a VCO ADC.

Specifically, the differential input paths to opamp 608 in the V/I converter 602 that receives the voltage signal v(t) is modified to include the passive mixer. A first input path includes a first pair of transistors, i.e., transistor 630 and transistor 632, of the passive mixer. The second input path has a second pair of transistors, i.e., transistor 640 and transistor 642, of the passive mixer. During a first period, transistor 630 and transistor 632 can be driven by $LO_{90°}$ and $\overline{LO_{90°}}$, respectively, and transistor 640 and transistor 642 can be driven by $LO_{90°}$ and $\overline{LO_{90°}}$, respectively. During a second period, transistor 630 and transistor 632 can be driven by $LO_{270°}$ and $\overline{LO_{270°}}$, respectively, and transistor 640 and transistor 642 can be driven by $LO_{270°}$ and $\overline{LO_{270°}}$, respectively.

The following passages explain how the timing error of a DAC cell can be extracted using square waves, as performed by the circuitry illustrated in FIGS. 4-6.

Figure 7:
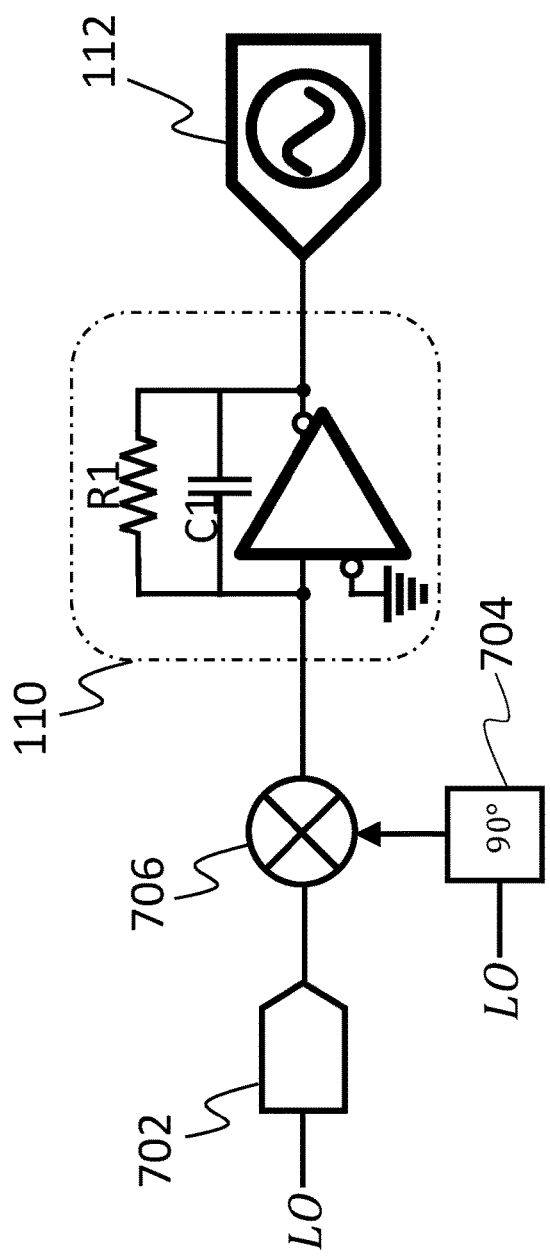
FIG. 7 illustrates mixing an output of a DAC cell using a first quadrature phase signal that is 90° out of phase, according to some embodiments of the disclosure.

FIG. 7 illustrates mixing an output of a DAC cell 702 using a first quadrature phase signal that is 90° out of phase, according to some embodiments of the disclosure. Specifically, a first known signal LO drives the DAC cell 702 during the first period. The first known signal is a square wave with a fixed frequency, and controls the pair of switches (transistors) that steers a current of the DAC cell 702. A quadrature phase signal generator 704 shifts the phase of the first known signal by 90° and generates the first quadrature phase signal $LO_{90°}$. A mixer 706 mixes the output of the DAC cell 702 using the first quadrature signal $LO_{90°}$. The mixer 706 down-converts the timing skew component to DC. A VCO ADC 112 generates a first digital output for a first measurement. In some embodiments, the first quadrature phase signal drives the DAC cell 702 and the first known signal is used by the mixer to mix the output of the DAC cell 702.

Figure 8:
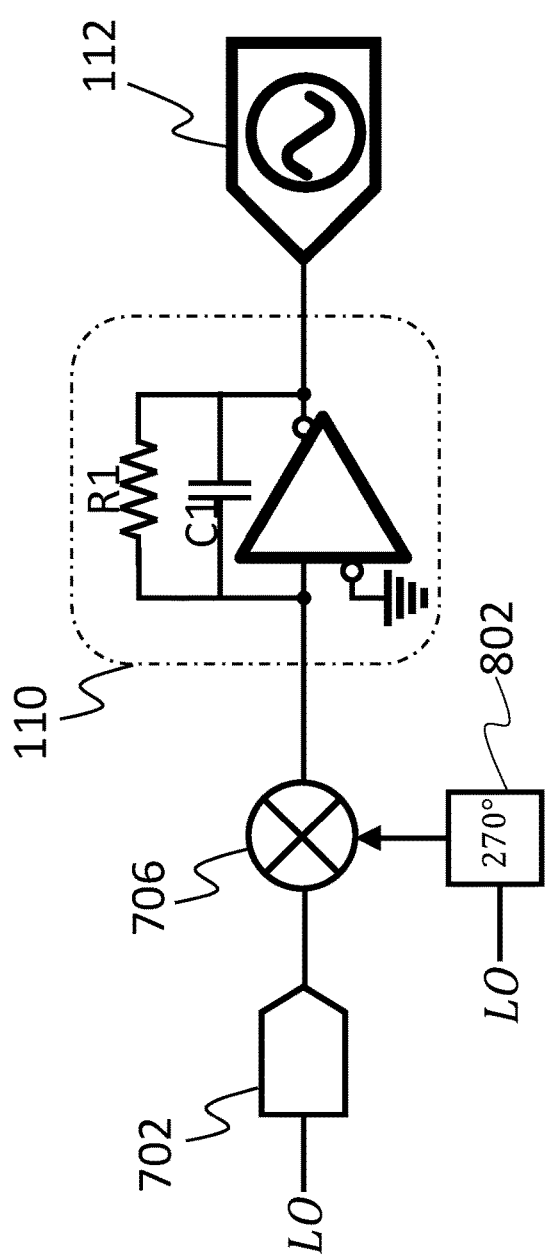
FIG. 8 illustrates mixing the output of the DAC cell using a second quadrature phase signal that is 270° out of phase, according to some embodiments of the disclosure.

FIG. 8 illustrates mixing the output of the DAC cell using a second quadrature phase signal that is 270° out of phase, according to some embodiments of the disclosure. Specifically, the first known signal LO drives the DAC cell 702 during the second period. A quadrature phase signal generator 802 (which can be the same as the quadrature phase signal generator 704 of FIG. 7) shifts the phase of the first known signal by 270° and generates the second quadrature phase signal $LO_{270°}$. A mixer 706 mixes the output of the DAC cell 702 using the second quadrature signal $LO_{270°}$. The mixer 706 down-converts the timing skew component to DC. The VCO ADC 112 generates a second digital output for a second measurement. In some embodiments, the second quadrature phase signal drives the DAC cell 702 and the first known signal is used by the mixer to mix the output of the DAC cell 702.

After obtaining the first digital output and the second digital output, processing circuitry (e.g., processing circuitry 442) can extract a timing skew of the DAC cell 702 through subtraction. Subtraction removes or cancels out a DC component or offset in the signal path having the DAC cell, the mixer, and the VCO ADC, and helps to give an accurate measurement of the timing skew component. Specifically, the processing circuitry can subtract the first measurement (e.g., based on a first digital output generated during the first period) by the second measurement (e.g., based on second digital output generated during the second period). The processing circuitry 442 can determine a first average of the first digital output and a second average of the second digital output, and determine a difference between the first average and the second average. Alternatively, the processing circuitry 442 can determine an average of a difference between the first digital output and a second digital output. The result from obtaining a difference of the first measurement and the second measurement yields a measurement of the timing skew component.

The derivation of the timing skew component based on the first measurement and the second measurement is explained in greater detail with FIGS. 9 and 10. FIG. 9 shows a plot of the driving the DAC cell and the first quadrature phase signal $LO_{90°}$ used by the mixer, according to some embodiments of the disclosure. The first known signal LO (driving the DAC cell) is shown as waveform 902. The first quadrature phase signal $LO_{90°}$ (used by the mixer) is shown as waveform 904. The waveform 902 and the waveform 904 thus represents the square waves used for making the first measurement. The timing skew error is represented as $\Delta$ and mixing can be treated as a product of the two waveforms. During the period $t_1$, the mixer output is a product of the two waveforms, and can be represented as: $(+1+\Delta)(+1)+(+1)(-1)=+\Delta$. Same result is obtained during other periods such as $t_2$.

FIG. 10 shows a plot of the first known signal LO driving the DAC cell and the second quadrature phase signal $LO_{270°}$ used by the mixer, according to some embodiments of the disclosure. The first known signal LO (driving the DAC cell) is shown as waveform 1002. The first quadrature phase signal $LO_{90°}$ (used by the mixer) is shown as waveform 1004. The waveform 1002 and the waveform 1004 thus represents the square waves used for making the second measurement. During the period $t_1$, the mixer output is a product of the two waveforms, and can be represented as: $(+1+\Delta)(-1)+(+1)(+1)=-\Delta$. Same result is obtained during other periods such as $t_2$.

The difference between the mixer output of the first measurement illustrated by FIG. 9 and the mixer output of the second measurement illustrated by FIG. 10 is thus $+\Delta-\Delta=+2\Delta$. The difference represents twice the timing skew component, or phrased differently, captures the timing error occurring at each transition in the signal driving the DAC cell (i.e., the rising edge and the falling edge). Additionally, the DC offset that is present in the signal path is cancelled through subtraction.

Timing Error Measurement Using Random Signals

Another type of known signal that can be used to extract a timing error of a DAC cell is random signals. Using random signals can be beneficial because it can avoid clock related spurs in the system occurring at fs/4, fs/8, fs/16, etc. (fs is the sampling frequency of the system). The spurs can affect measurement frequency. Using a random signal can avoid such clock related spurs, and avoid the need and trouble of generating square waves having a frequency of fs divided by a non-integer or prime number.

For a first measurement being made during a first period (of time), the DAC cell is driven by a first random signal and a mixer in the signal path mixes the signal using a second random signal having a quadrature phase shift (e.g., 90° or 270°) relative to the first random signal. For a second measurement being made during a second period (of time), the DAC cell is driven by the second random signal and the mixer in the signal path mixes the signal using the first random signal. The first period and the second period can have the same duration.

Figure 11:
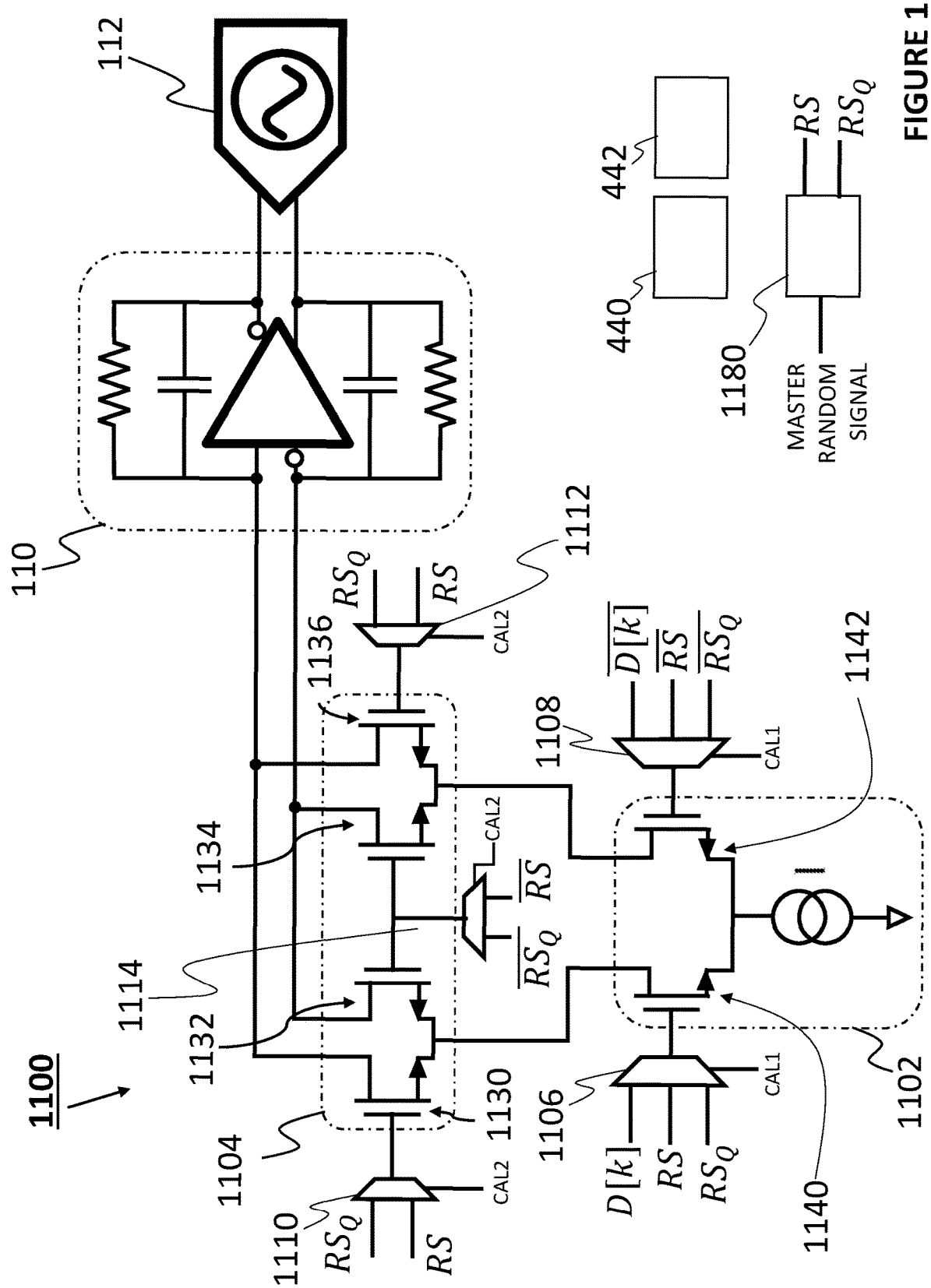
FIG. 11 shows a DAC cell, a mixer, and a VCO ADC to measure timing error of the DAC cell, using random signals, according to some embodiments of the disclosure.

FIG. 11 shows a DAC cell 1102, a mixer 1104, and a VCO ADC 112 to measure timing error of the DAC cell 1102, using random signals, according to some embodiments of the disclosure. The DAC cell 1102 is part of a DAC comprising a plurality of DAC cells (other DAC cells are not shown for simplicity). Similar to the DAC cells illustrated in FIG. 2, the DAC cell 1102 is a current-steering DAC cell.

The DAC cell 1102 has a current source (denoted as "I" in the FIGURE) and a pair of current-steering switches coupled to the current source for steering the current. The pair of current-steering switches are shown as transistor 1140 and transistor 1142. The transistor 1140 and transistor 1142 are controlled by signals at the gates of transistor 1140 and transistor 1142.

Downstream of the DAC cell 1102 is a mixer 1104 shown to illustrate a mixing function that occurs during the two measurements. Mixer 1104 is a passive mixer, sometimes referred to as the Gilbert mixer. Mixer 1104 has two pairs of transistors, i.e., four transistors total. A first pair of transistors, i.e., transistor 1130 and transistor 1132, are coupled to and downstream of the transistor 1140. A second pair of transistors, i.e., transistor 1134 and transistor 1136, are coupled to and downstream of the transistor 1142. The mixer 1104 is a current mixer that mixes a current output of the DAC cell 1102.

During normal operation, i.e., not during calibration, transistor 1140 and transistor 1142 are to be driven or controlled by respective data signals, i.e., an input bit D[k] and inverted input bit $\overline{D[k]}$ respectively. Specifically, transistor 1140 and transistor 1142 are to be driven or controlled by respective data signals, i.e., an input bit D[k] and inverted input bit $\overline{D[k]}$ respectively, to steer the current from the current source. The input bit D[k] and inverted input bit $\overline{D[k]}$ can steer the current from the current source through one of the transistors (when one transistor is conducting current and the other transistor is not conducting current). During calibration, transistor 1140 and transistor 1142 are to be driven or controlled by the first random signal, i.e., a first random signal RS and an inverted version of the first random signal $\overline{RS}$ respectively, during a first period to make a first measurement. Additionally, transistor 1140 and transistor 1142 are to be driven or controlled by the second random signal, i.e., a second random signal $RS_Q$ and an inverted version of the first random signal $\overline{RS_Q}$ respectively, during a second period to make a second measurement. A multiplexer, e.g., mux 1106 and mux 1108, can select and provide, based on a calibration signal (e.g., shown as CAL1 in the FIGURE), the first random signal (RS and $\overline{RS}$), the second random signal ($RS_Q$ and $\overline{RS_Q}$), or a data signal (D[k] and $\overline{D[k]}$), to the DAC cell 402. For instance, the multiplexer can provide, based on a first calibration signal (CAL1), the first random signal (RS and RS) during the first period, the second random signal ($RS_Q$ and $\overline{RS_Q}$) during the second period, and (D[k] and $\overline{D[k]}$) a data signal during a third period, to the DAC cell 1102.

To make the first measurement, during the first period, the DAC cell 1102 is driven by the first random signal (RS and $\overline{RS}$), and the mixer 1104 is driven by the second random signal ($RS_Q$ and $\overline{RS_Q}$). Specifically, the second random signal is a quadrature phase counterpart of the first random signal. For instance, the second random signal can be 90° out of phase with respect to the first random signal. Accordingly, the mixer mixes the output of the DAC cell 1102 using the second random signal during the first period. For instance, the first pair of transistors of the mixer 1104, i.e., transistor 1134 and transistor 1136, can be driven by $RS_{Q°}$ and its inverted counterpart $\overline{RS_{Q°}}$ respectively. Also, the second pair of transistors of the mixer 1104, i.e., transistor 1136 and transistor 1134, can be driven by $RS_{Q°}$ and its inverted counterpart $\overline{RS_Q}$ respectively.

To make the second measurement, during the second period, the DAC cell 1102 is driven by the second random signal ($RS_Q$ and $\overline{RS_Q}$), and the mixer 1104 is driven by the first random signal (RS and $\overline{RS}$). Note that when the second random signal ($RS_Q$ and $\overline{RS_Q}$) is 90° out of phase with respect to the first random signal (RS and $\overline{RS}$), the first random signal (RS and $\overline{RS}$) is 270° out of phase with the second random signal ($RS_Q$ and $\overline{RS_Q}$). The first random signal and the second random signal can serve as each other's quadrature counterparts. Accordingly, the mixer mixes the output of the DAC cell 1102 using the first random signal (RS and RS) during the second period. For instance, the first pair of transistors of the mixer 1104, i.e., transistor 1130 and transistor 1132, can be driven by RS and its inverted counterpart RS respectively. Also, the second pair of transistors of the mixer 1104, i.e., transistor 1136 and transistor 1134, can be driven by RS and its inverted counterpart $\overline{RS}$ respectively.

To provide the appropriate signals to the mixer 1104 during the first period and the second period, a second multiplexer (e.g., mux 1110, mux 1112, and/or mux 1114) can be select and provide, based on a second calibration signal (shown as CAL2 in the FIGURE), the second random signal ($RS_Q$ and $\overline{RS_Q}$) during the first period, and the first random signal (RS and $\overline{RS}$) during the second period, to the mixer 1104.

A quadrature signal generator, e.g., quadrature signal generator 1180, can be implemented to generate the first random signal (RS and $\overline{RS}$) and second random signal ($RS_Q$ and $\overline{RS_Q}$), based on master (pseudo-)random signal. Exemplary circuitry and waveforms for a quadrature signal generator are shown in FIGS. 12 and 13 respectively.

A non-transitory storage medium 440 (e.g., memory) can be included to store digital output of the VCO ADC 112, e.g., a first digital output generated by the VCO ADC 112 during the first period, and a second digital output generated by the VCO ADC 112 during a second period. The digital output can be used for extracting the timing error of the DAC cell 1102. Processing circuitry 442 can be included to perform such processing, including extracting a timing error of the DAC cell 402 based on digital output of the VCO ADC generated during the first period and the second period. The processing circuitry 442 can include one or more of: specialized digital circuitry/hardware to perform the processing, and a (micro)processor that can execute instructions to perform the processing.

As illustrated previously in FIG. 6, the mixer can be in a signal path between the DAC and a ring oscillator of the VCO ADC 112. The VCO ADC 112 can include a V/I converter (e.g., V/I converter 602) to drive a current-controlled-ring-oscillator (e.g., ICRO 604), and the mixer is embedded in the V/I converter. Embedding the mixer within the VCO ADC 112 avoids the need to modify the DAC circuits and architecture.

Figure 12:
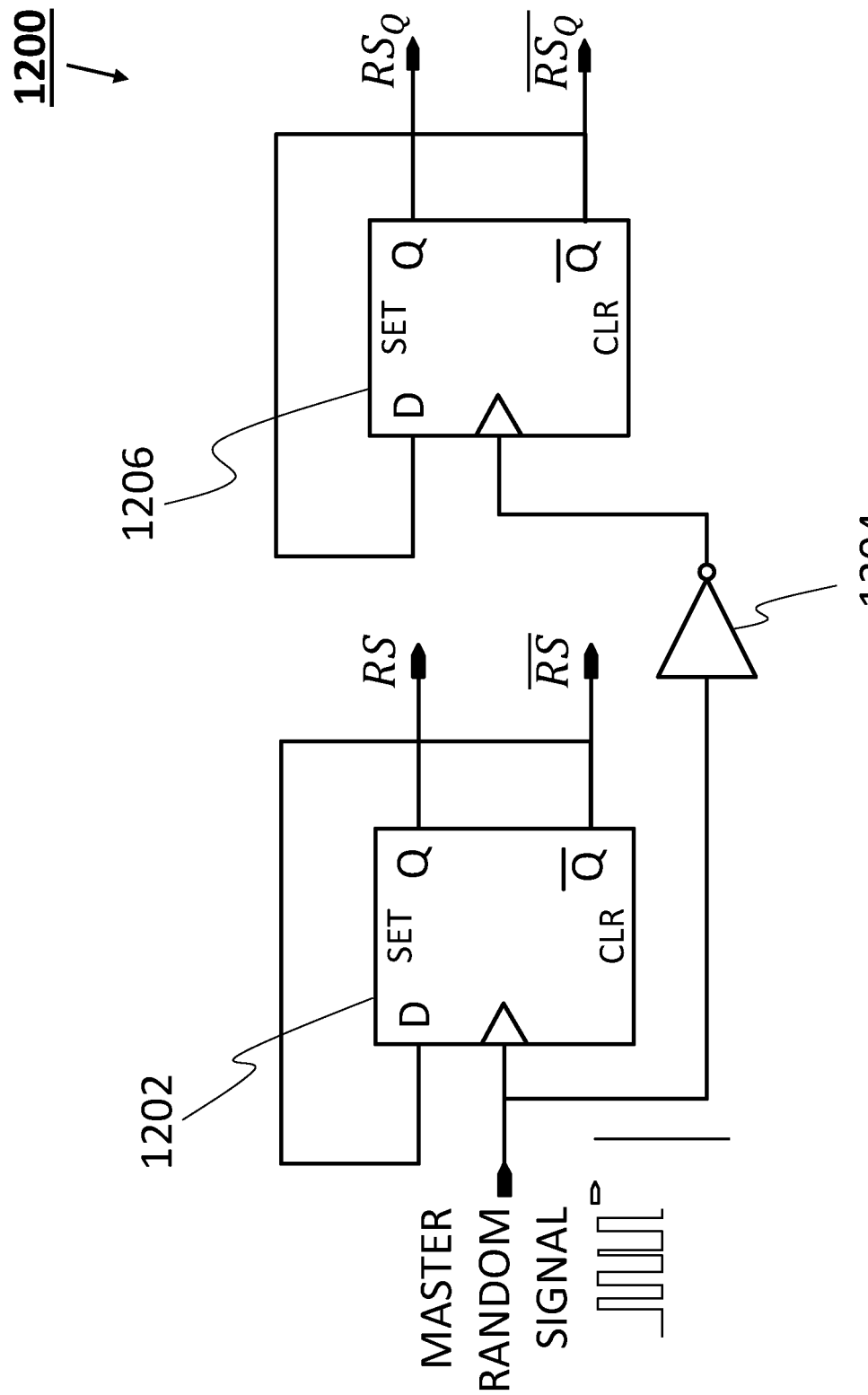
FIG. 12 shows another exemplary quadrature phase signal generator, according to some embodiments of the disclosure.
Figure 13:
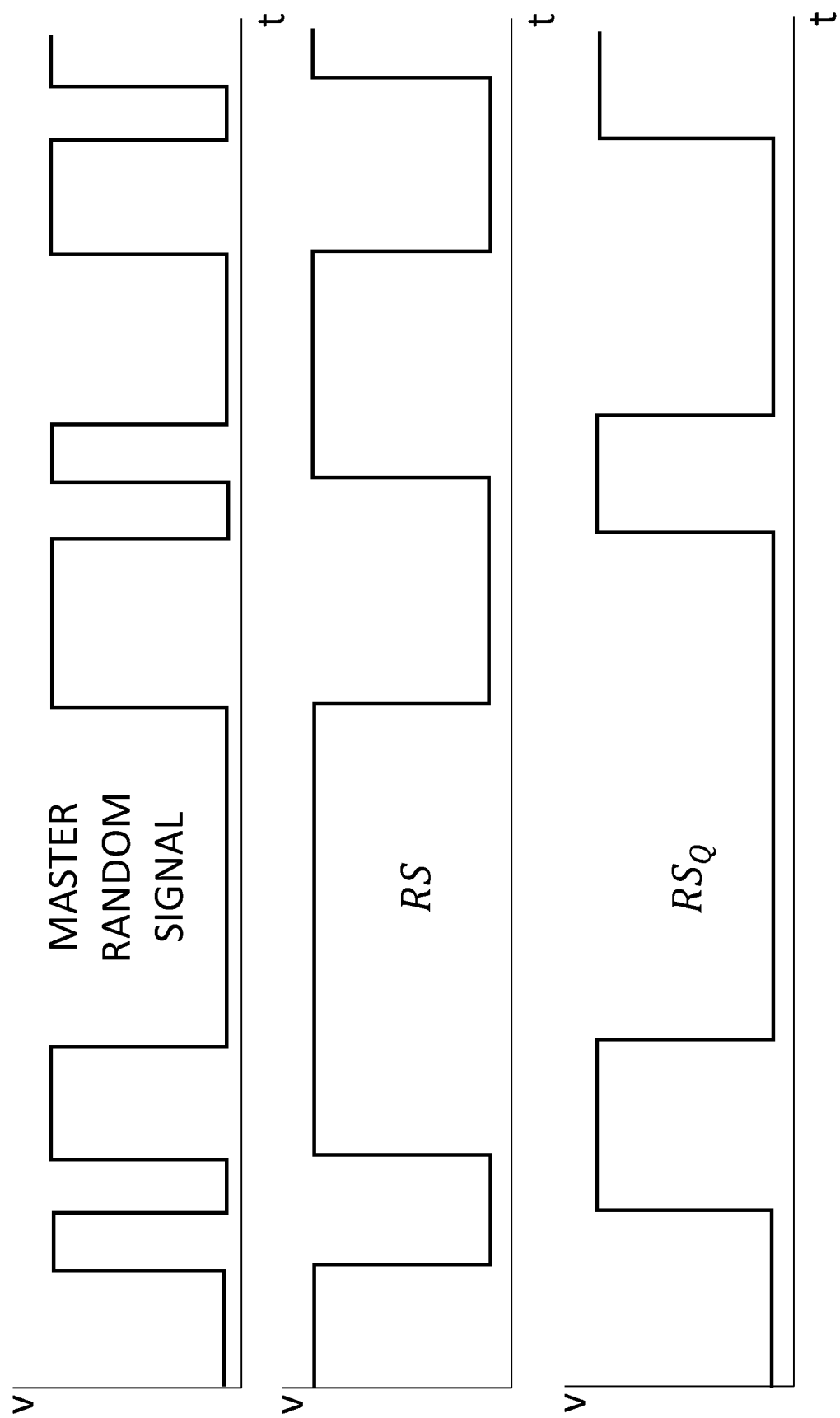
FIG. 13 shows a plot of a master random signal, a first random signal, and a second random signal having a quadrature phase shift relative to the first random signal, according to some embodiments of the disclosure.

FIG. 12 shows an exemplary quadrature phase signal generator 1200, according to some embodiments of the disclosure. The quadrature phase signal generator 1200 can use a master random signal to generate the first random signal (RS and RS) and the second random signal ($RS_Q$ and $\overline{RS_Q}$). Specifically, the quadrature phase signal generator 1200 can generate the first random signal and the second random signal based on alternative edges of the master random signal, e.g., low-to-high edge transitions (rising edge transitions) of a master random signal and high-to-low edge transitions (falling edge transitions) of the master random signal.

The quadrature phase signal generator 1200 comprises a plurality of D flip-flops to generate the first random signal and the second random signal. In the example shown, the quadrature phase signal generator 1200 comprises a first D flip-flop 1202 and a second D flip-flop 1206. The first D flip-flop 1202 receives and is clocked by, e.g., the master random signal. The first D flip-flop 1202 receives an inverted output Q of the first D flip-flop 1202 at the data input D of the first D flip-flop 1202. The first D flip-flop 1202 generates the first random signal RS at the output Q of the first D flip-flop 1202. Note that the inverted version of the first random signal $\overline{RS}$ is also generated and is available at the inverted output $\overline{Q}$ of the first D flip-flop 1202. The second D flip-flop 1206 receives and is clocked by an inverted master random signal generated by an inverter 1204. The inverted master random signal is an inverted version of the master random signal driving the first D flip-flop 1202. The inverter 1204 receives and inverts, e.g., the master random signal. The second D flip-flop 1206 receives an inverted output $\overline{Q}$ of the second D flip-flop 1206. The second D flip-flop 1206 generates the second random signal $RS_Q$ at an output Q of the second D flip-flop 1206. Note that the inverted version of the second random signal $\overline{RS_Q}$ is also generated and is available at the inverted output $\overline{Q}$ of the second D flip-flop 1206.

FIG. 13 shows a plot of a master random signal, a first random signal RS, and a second random signal $RS_Q$ having a quadrature phase shift relative to the first random signal RS, according to some embodiments of the disclosure. Referring back to FIG. 12, the first D flip-flop 1202 can generate the first random signal RS, and the second D flip-flop 1206 can generate the second random signal $RS_Q$. The first D flip-flop 1202 that is generating the first random signal RS triggers or changes the state of its output at the positive edges or low-to-high transitions of the master random signal. The second D flip-flop 1206 that is generating the second random signal $RS_Q$ changes triggers or changes the state of its output at the negative edges or high-to-low transitions of the master random signal. The first random signal RS and the second random signal $RS_Q$ are 90° out of phase with respect to each other.

The following passages explain how the timing error of a DAC cell can be extracted using random signals as performed by the circuitry illustrated in FIGS. 6, 11, and 12.

Figure 14:
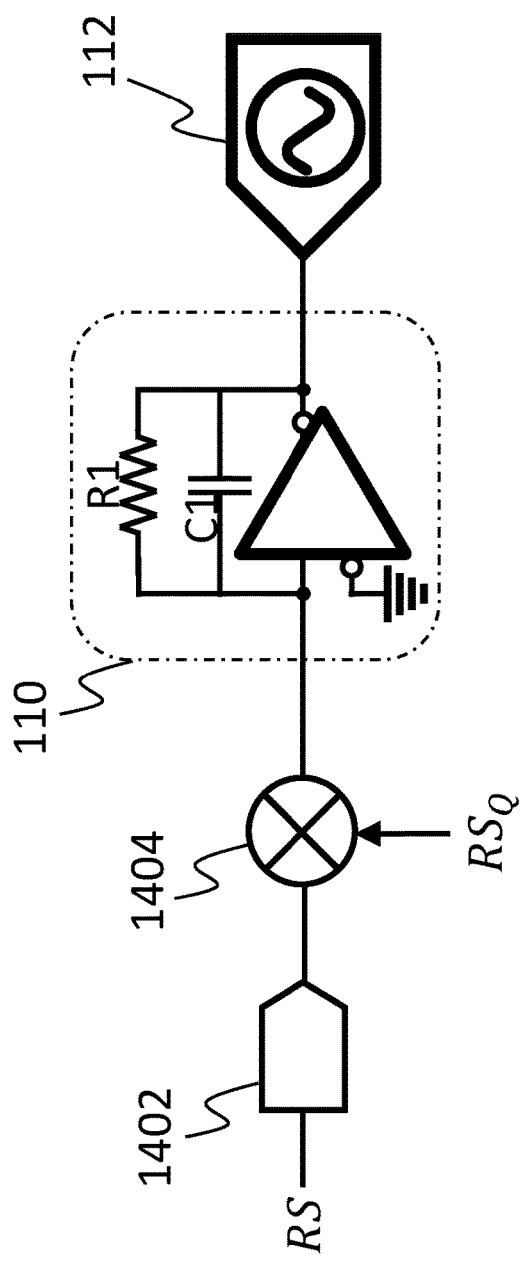
FIG. 14 illustrates driving the DAC cell by the first random signal and mixing an output of the DAC cell using the second random signal, according to some embodiments of the disclosure.

FIG. 14 illustrates driving the DAC cell 1402 by the first random signal RS and mixing an output of the DAC cell using the second random signal $RS_Q$, according to some embodiments of the disclosure. Specifically, the first random signal RS drives the DAC cell 1402 during the first period. The first random signal RS controls the pair of switches (transistors) that steers a current of the DAC cell 1402. A quadrature phase signal generator generates the second random signal $RS_Q$, where the second random signal $RS_Q$ is a quadrature phase counterpart of the first random signal RS (90° out of phase with respect to the first random signal RS). A mixer 1404 mixes the output of the DAC cell 1402 using second random signal $RS_Q$. The mixer 1404 down-converts the timing skew component to DC. A VCO ADC 112 generates a first digital output for a first measurement.

Figure 15:
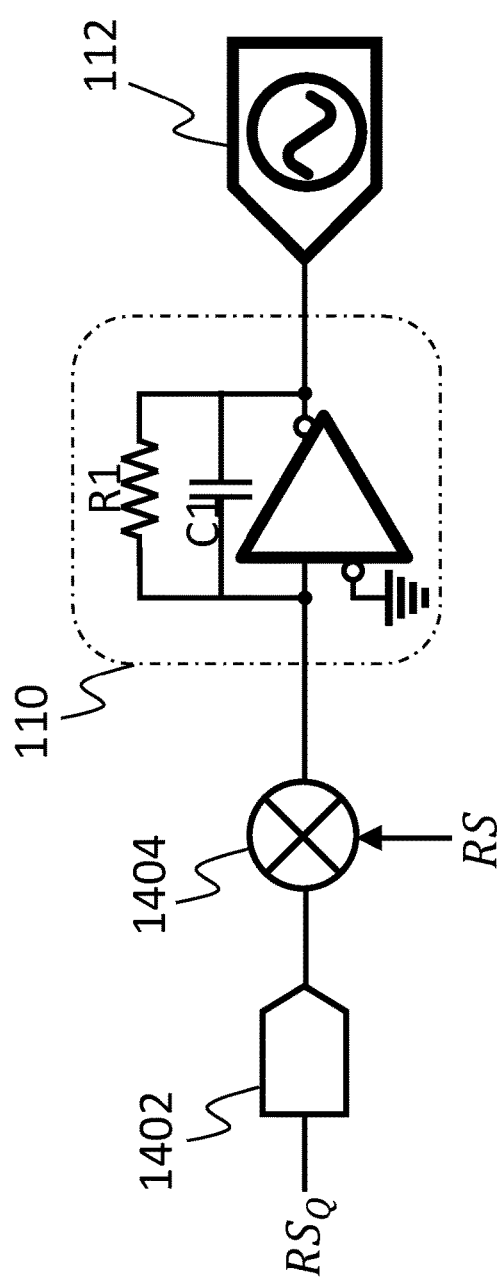
FIG. 15 illustrates driving the DAC cell by the second random signal and mixing the output of the DAC cell using the first random signal, according to some embodiments of the disclosure.

FIG. 15 illustrates driving the DAC cell 1402 by the second random signal $RS_Q$ and mixing the output of the DAC cell 1402 using the first random signal RS, according to some embodiments of the disclosure. Specifically, the second random signal $RS_Q$ drives the DAC cell 1402 during the second period. A quadrature phase signal generator generates the first random signal RS, where the first random signal RS is a quadrature phase counterpart of the second random signal $RS_Q$ (270° out of phase with respect to the second random signal $RS_Q$). A mixer 1404 mixes the output of the DAC cell 1402 using the first random signal RS. The mixer 1404 down-converts the timing skew component to DC. The VCO ADC 112 generates a second digital output for a second measurement.

After obtaining the first digital output and the second digital output, processing circuitry (e.g., processing circuitry 442) can extract a timing skew of the DAC cell 1402 through subtraction. Subtraction removes or cancels out a DC component or offset in the signal path having the DAC cell, the mixer, and the VCO ADC, and helps to give an accurate measurement of the timing skew component. Specifically, the processing circuitry can subtract the first measurement (e.g., based on a first digital output generated during the first period) by the second measurement (e.g., based on second digital output generated during the second period). The processing circuitry 442 can determine a first average of the first digital output and a second average of the second digital output, and determine a difference between the first average and the second average. Alternatively, the processing circuitry 442 can determine an average of a difference between the first digital output and a second digital output. The result from obtaining a difference of the first measurement and the second measurement yields a measurement of the timing skew component.

Figure 16:
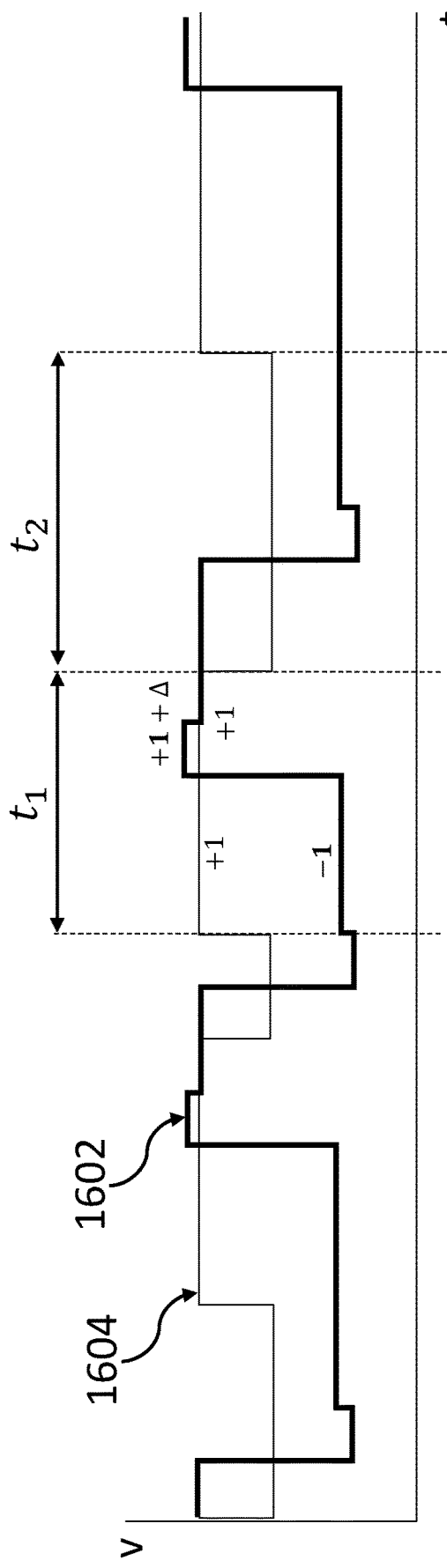
FIG. 16 shows a plot of the first random signal driving the DAC cell and second random signal used by the mixer, according to some embodiments of the disclosure.
Figure 17:
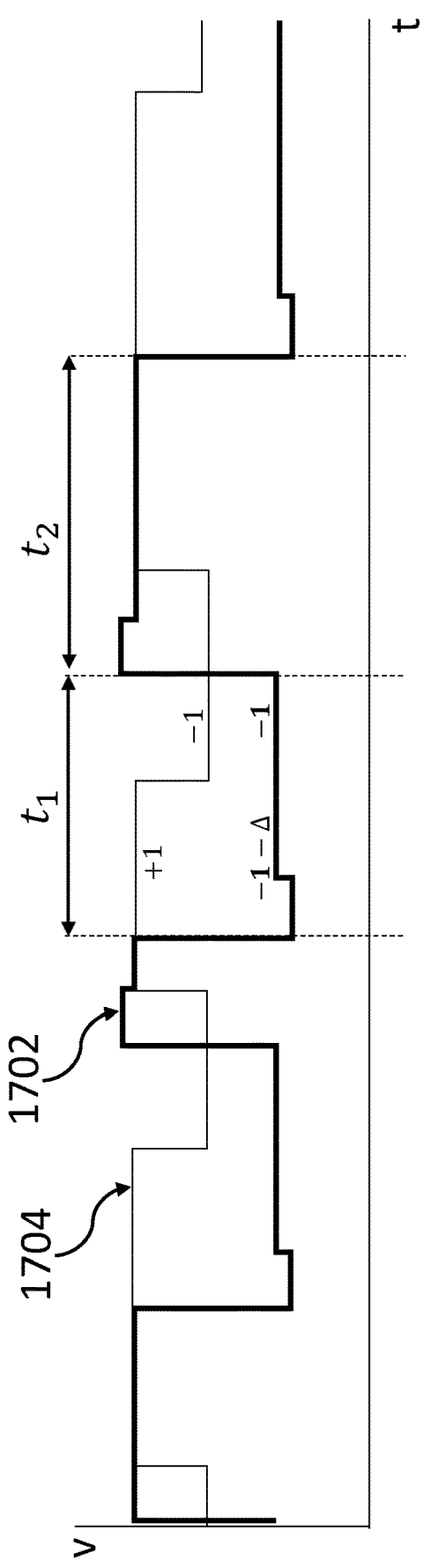
FIG. 17 shows a plot of the second random signal driving the DAC cell and the first random signal used by the mixer, according to some embodiments of the disclosure.

The derivation of the timing skew component based on the first measurement and the second measurement is explained in greater detail with FIGS. 16 and 17.

FIG. 16 illustrates the first random signal driving the DAC cell and second random signal used by the mixer, according to some embodiments of the disclosure. The first random signal RS (driving the DAC cell) is shown as waveform 1602. The second random signal $RS_Q$ (used by the mixer) is shown as waveform 1604. The waveform 1602 and the waveform 904 thus represents the random signals used for making the first measurement. The timing skew error is represented as A and mixing can be treated as a product of the two waveforms. During the period $t_1$, the mixer output is a product of the two waveforms, and can be represented as: $(+1)(-1)+(+1+\Delta)(+1)=+\Delta$. Same result is obtained during other periods such as $t_2$.

FIG. 17 shows a plot of the second random signal driving the DAC cell and the first random signal used by the mixer, according to some embodiments of the disclosure. The second random signal $RS_Q$ (driving the DAC cell) is shown as waveform 1702. The first random signal RS (used by the mixer) is shown as waveform 1704. The waveform 1702 and the waveform 1704 thus represents the random signals used for making the second measurement. During the period $t_1$, the mixer output is a product of the two waveforms, and can be represented as: $(+1)(-1-\Delta)+(+1)(-1)=-\Delta$. Same result is obtained during other periods such as $t_2$.

The difference between the mixer output of the first measurement illustrated by FIG. 16 and the mixer output of the second measurement illustrated by FIG. 17 is thus $+\Delta-\Delta=+2\Delta$. The difference represents twice the timing skew component, or phrased differently, captures the timing error occurring at each transition in the signal driving the DAC cell (i.e., the rising edge and the falling edge). Additionally, the DC offset that is present in the signal path is cancelled through subtraction.

Why Quadrature Phase Signals Work for Extracting a Timing Skew Component

When a sine wave with phase shift of φ, is mixed with a 90° phase shifted signal at the same frequency, the first mixed signal is:

$$\sin(\omega t + \varphi) * \cos(\omega t) = \frac{e^{j(\omega t+\varphi)} - e^{-j(\omega t+\varphi)}}{2j} * \frac{e^{j(\omega t)} + e^{-j(\omega t)}}{2} =$$

$$\frac{e^{j(2\omega t+\varphi)} - e^{-j(\varphi)} + e^{j(\varphi)} - e^{-j(2\omega t+\varphi)}}{4j} = \frac{\sin\varphi}{2} + \frac{\sin(2\omega t + \varphi)}{2}$$

When a sine wave, with phase shift of φ, is mixed with a 270° phase shifted signal at the same frequency, the second mixed signal is:

$$\sin(\omega t + \varphi) * \cos(\omega t + \pi) = \frac{e^{j(\omega t+\varphi)} - e^{-j(\omega t+\varphi)}}{2j} * \frac{e^{j(\omega t+\pi)} + e^{-j(\omega t+\pi)}}{2} =$$

$$\frac{e^{j(2\omega t+\varphi+\pi)} - e^{-j(\varphi+\pi)} + e^{j(\varphi-\pi)} - e^{-j(2\omega t+\varphi+\pi)}}{4j} = -\frac{\sin\varphi}{2} - \frac{\sin(2\omega t + \varphi)}{2}$$

The difference of the first mixed signal and the second mixed signal at DC is sin φ, which is approximately φ, when φ is small. Therefore, a timing error can be extracted by making two measurements and subtracting the two measurements in the manner described herein.

Method to Measure Timing Errors of a DAC

Figure 18:
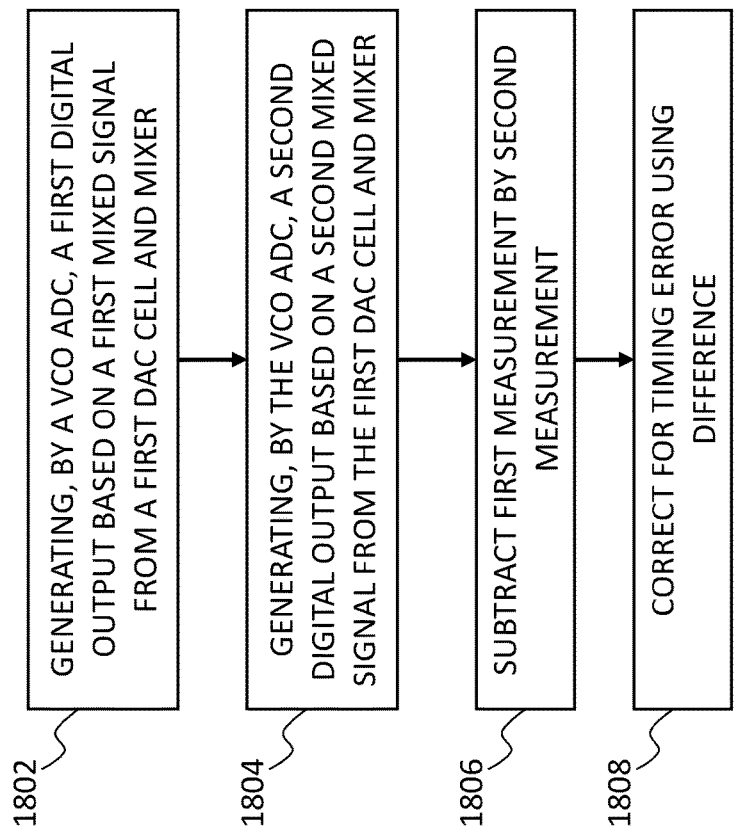
FIG. 18 is a flow diagram illustrating a method to measure and correct for timing errors of a DAC, according to some embodiments of the disclosure.

FIG. 18 is a flow diagram illustrating a method to measure and correct for timing errors of a DAC, according to some embodiments of the disclosure. In 1802, a VCO ADC generates a first digital output based on a first mixed signal from a first DAC cell driven by a first known signal and a mixer mixing a first signal generated by the first DAC cell by a first quadrature phase signal. In 1802, the VCO ADC generates a second digital output based on a second mixed signal from the first DAC cell driven by a second known signal and the mixer mixing a second signal generated by the first DAC cell by a second quadrature phase signal. In 1806, processing circuitry subtracts a first measurement based on the first digital output by a second measurement based on the second digital output. In 1808, a timing error can be corrected based on a difference obtained from subtracting the first measurement and the second measurement.

Subtracting the first measurement by the second measurement can remove a direct current (DC) offset in a signal path having the first DAC cell, the mixer, and the VCO ADC.

The method illustrated in FIG. 18 can be repeated for a second DAC cell and other DAC cells of a DAC.

In some embodiments, the first quadrature phase signal is 90 degrees out of phase with respect to the first known signal. The second quadrature phase signal is 270 degrees out of phase with respect to the second known signal.

In some embodiments, the first known signal is a square wave, and the second known signal is the same square wave. Exemplary embodiments are illustrated by FIGS. 4-10.

In some embodiments, a quadrature phase signal generator generates the first known signal, the first quadrature phase signal, and the second quadrature phase signal from a clock signal and an inverted clock signal. Exemplary embodiments are illustrated by FIGS. 6, and 11-17.

In some embodiments, the first known signal is a first random signal generated from a master random signal, and the second known signal is a second random signal generated from the master random signal. Additionally, the first quadrature phase signal is the second random signal generated from the master random signal, and the second quadrature phase signal is the first random signal generated from the master random signal. In some cases, the first known signal is generated based on rising edge transitions of a master random signal, and the second known signal is generated based on falling edge transitions of the master random signal. An exemplary quadrature phase signal generator generating such random signals is shown in FIG. 12. Exemplary scheme to measure timing error using such random signals is illustrated by FIGS. 11 and 14-16.

Additional Considerations

The digital blocks in the system can cause digital spurs at certain frequencies. This will be an issue if one of the digital spurs coincide with the frequency of the square waves used for measuring the timing errors. The digital spur's energy can be mixed to DC as well and affect the measurement. One option to address this issue is to choose square waves that will not coincide with the certain frequencies. Another option is to turn off the digital blocks when performing timing error measurement. The technique to measure the timing error using random signals can address this issue as well by introducing randomization, which can spread the energy of the digital spurs to the noise floor.

The phase error from generating the quadrature phase signals can manifest as a DC value as well. This can introduce a fixed error for all the measurement. Note that a timing error is obtained for all of the DAC cells, and the timing errors not absolute, but relative to each other. As long as the phase error introduces a fixed error or constant shift for all the DAC cells, calibration based on the timing errors obtained for all of the DAC cells would not be negatively affected.

EXAMPLES

The DAC under calibration can be a DAC in CT ADCs as long as the DAC has a VCO ADC as an observer ADC. While using a delta-sigma ADC as the observer ADC is possible in some embodiments, using a VCO ADC is preferable because of its infinite DC gain (meaning accuracy of measurement is higher), and it is practical to integrate a mixer in the V/I converter of the VCO ADC. Having a VCO ADC serving as the observer ADC already in a converter system downstream of the DAC under calibration obviates the need for any additional circuitry that may be needed to sense or measure the DAC timing errors. This can save power and area, and reduce complexity of the converter system.

Examples of CT ADCs can include: successive-approximation-register ADCs, delta-sigma ADCs (which has a DAC in its feedback path), pipelined ADCs, and multi-stage noise-shaping ADCs (which has cascaded delta-sigma ADCs). The DAC under calibration can be a stand-alone DAC with an observer ADC, such as a VCO ADC.

Example 1 is a method to measure and correct for timing errors of a digital-to-analog converter (DAC), comprising: generating, by a voltage-controlled-oscillator analog-to-digital converter (VCO ADC), a first digital output based on a first mixed signal from a first DAC cell driven by a first known signal and a mixer mixing a first signal generated by the first DAC cell by a first quadrature phase signal; generating, by the VCO ADC, a second digital output based on a second mixed signal from the first DAC cell driven by a second known signal and the mixer mixing a second signal generated by the first DAC cell by a second quadrature phase signal; subtracting a first measurement based on the first digital output by a second measurement based on the second digital output; and correcting a timing error based on a difference obtained from subtracting the first measurement and the second measurement.

In Example 2, the method of Example 1 can optionally include: the first quadrature phase signal being 90 degrees out of phase with respect to the first known signal; and the second quadrature phase signal being 270 degrees out of phase with respect to the second known signal.

In Example 3, the method of Example 1 or 2 can optionally include: the first known signal being a square wave; and the second known signal being the same square wave.

In Example 4, the method of any one of Examples 1-3 can optionally include: generating the first known signal, the first quadrature phase signal, and the second quadrature phase signal from a clock signal and an inverted clock signal.

In Example 5, the method of Example 1 or 2 can optionally include the first known signal being a first random signal generated from a master random signal; and the second known signal being a second random signal generated from the master random signal.

In Example 6, the method of Example 5 can optionally include: the first quadrature phase signal being the second random signal generated from the master random signal; and the second quadrature phase signal being the first random signal generated from the master random signal.

In Example 7, the method of any one of Examples 1-2, and 5-6 can optionally include: generating the first known signal based on rising edge transitions of a master random signal; and generating the second known signal based on falling edge transitions of the master random signal.

In Example 8, the method of any one of Examples 1-7 can optionally include: subtracting the first measurement by the second measurement removes a direct current (DC) offset in a signal path having the first DAC cell, the mixer, and the VCO ADC.

In Example 9, the method of any one of Examples 1-8 can optionally include: repeating the generating, subtracting, and correcting steps for a second DAC cell.

Example 10 is a data converter with timing error calibration, comprising: a digital-to-analog converter (DAC) comprising a DAC cell driven by a first known signal during a first period and a second period; a voltage-controlled-oscillator analog-to-digital converter (VCO ADC) to quantize and observe an output of the DAC, wherein: the VCO ADC comprises a voltage-to-current converter to drive a current-controlled-ring-oscillator, the voltage-to-current converter comprises an embedded mixer, and the embedded mixer is driven by a first quadrature phase signal during the first period and by a second quadrature phase signal during the second period; and processing circuitry to extract a timing error of the DAC cell based on digital output of the VCO ADC generated during the first period and the second period.

In Example 11, the data converter of Example 10 can optionally include: the DAC further comprising a multiplexer to provide, based on a calibration signal, the first known signal or a data signal to the DAC cell.

In Example 12, the data converter of Example 10 or 11 can optionally include: a quadrature phase signal generator to generate the first known signal, the first quadrature phase signal, and the second quadrature phase signal.

In Example 13, the data converter of any one of Examples 10-12 can optionally include: a first data flip-flop to receive a clock signal and an inverted output of the first data flip-flop, and generate the first known signal; and a second data flip-flop to receive an inverted clock signal and an inverted output of the second data flip-flop, generate the first quadrature phase signal at an output of the second data flip-flop, and generate the second quadrature phase signal at an inverted output of the second data flip-flop.

In Example 14, the data converter of any one of Examples 10-13, wherein the processing circuitry being further to subtract a first digital output generated during the first period by a second digital output generated during the second period.

Example 15 is a data converter with timing error calibration, comprising: a digital-to-analog converter (DAC) comprising a DAC cell driven by a first random signal during a first period and by a second random signal having a quadrature phase shift relative to the first random signal during a second period; an analog-to-digital converter (ADC) to quantize and observe an output of the DAC; a mixer in a signal path between the DAC and a ring oscillator of the VCO ADC, wherein the mixer is driven by the second random signal during the first period and by the first random signal during the second period; and processing circuitry to extract a timing error of the DAC cell based on digital output of the VCO ADC generated during the first period and the second period.

In Example 16, the data converter of Example 15 can optionally include the ADC comprising a voltage-to-current converter to drive a current-controlled-ring-oscillator; and the mixer is embedded in the voltage-to-current converter.

In Example 17, the data converter of Example 15 or 16 can optionally include: the DAC further comprising a first multiplexer to provide, based on a first calibration signal, the first random signal during the first period, the second random signal during the second period, and a data signal during a third period, to the DAC cell.

In Example 18, the data converter of any one of Examples 15-17 can optionally include: a second multiplexer to provide, based on a second calibration signal, the second random signal during the first period, and the first random signal during the second period, to the mixer.

In Example 19, the data converter of any one of Examples 15-18 can optionally include a quadrature phase signal generator to generate the first random signal and the second random signal based on low-to-high edge transitions of a master random signal and high-to-low edge transitions of the master random signal.

In Example 20, the data converter of any one of Examples 15-19, further comprising: a first data flip-flop to receive a master random signal and an inverted output of the first data flip-flop, and generate the first random signal; and a second data flip-flop to receive an inverted master random signal and an inverted output of the second data flip-flop, generate the second random signal at an output of the second data flip-flop.

Example A is an apparatus comprising means for implementing and/or carrying out the methods of any one of Examples 1-9 and/or any of the functionalities described herein.

Other Implementation Notes, Variations, and Applications

The present architecture for measuring timing errors of a DAC are particularly suitable for high-speed, high precision applications. Applications which can greatly benefit from the architecture include: instrumentation, testing, spectral analyzers, military purposes, radar, wired or wireless communications, mobile telephones (especially because standards continue to push for higher speed communications), and base stations.

In some embodiments, techniques for processing the measurements can be implemented with an on-chip microprocessor (i.e., on-chip with the ADC, executing instructions/firmware provided to the on-chip microprocessor) and/or dedicated on-chip digital hardware, to carry out digital signal processing functions. In various other embodiments, the digital functionalities may be implemented in one or more silicon cores in Application Specific Integrated Circuits (ASICs), Field Programmable Gate Arrays (FPGAs), and other semiconductor architectures.

All of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure, appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

The functions related to measuring timing error, such as the processes illustrated by FIG. 18, illustrate only some of the possible functions that may be executed by, or within, the circuits illustrated in the FIGURES or circuits coupled to the systems illustrated in the FIGURES (e.g., digital circuitry or an on-chip microprocessor). Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the disclosure, appended claims. Note that all optional features of the apparatus described above may also be implemented with respect to the method or process described herein and specifics in the examples may be used anywhere in one or more embodiments.

What is claimed is:

1. A method to measure and correct for timing errors of a digital-to-analog converter (DAC), comprising:
generating, by a voltage-controlled-oscillator analog-to-digital converter (VCO ADC), a first digital output based on a first mixed signal from a first DAC cell and a mixer, wherein the first DAC cell is driven by a first known signal and generates a first signal, and the first signal is mixed by a first quadrature phase signal;
generating, by the VCO ADC, a second digital output based on a second mixed signal from the first DAC cell and the mixer, wherein the first DAC cell is driven by a second known signal and generates a second signal, and the second signal is mixed by a second quadrature phase signal;
subtracting a first measurement based on the first digital output from a second measurement based on the second digital output; and
correcting a timing error based on a difference obtained from subtracting the first measurement from the second measurement.

2. The method of claim 1, wherein:
the first quadrature phase signal is 90 degrees out of phase with respect to the first known signal; and
the second quadrature phase signal is 270 degrees out of phase with respect to the second known signal.

3. The method of claim 1, wherein:
the first known signal is a square wave; and
the second known signal is the same square wave.

4. The method of claim 1, further comprising:
generating the first known signal, the first quadrature phase signal, and the second quadrature phase signal from a clock signal and an inverted clock signal.

5. The method of claim 1, wherein:
the first known signal is a first random signal generated from a master random signal; and
the second known signal is a second random signal generated from the master random signal.

6. The method of claim 5, wherein:
the first quadrature phase signal is the second random signal generated from the master random signal; and
the second quadrature phase signal is the first random signal generated from the master random signal.

7. The method of claim 1, further comprising:
generating the first known signal based on rising edge transitions of a master random signal; and
generating the second known signal based on falling edge transitions of the master random signal.

8. The method of claim 1, wherein subtracting the first measurement by the second measurement removes a direct current (DC) offset in a signal path having the first DAC cell, the mixer, and the VCO ADC.

9. The method of claim 1, further comprising:
repeating the generating, subtracting, and correcting steps for a second DAC cell.

10. A data converter with timing error calibration, comprising:

a digital-to-analog converter (DAC) comprising a DAC cell driven by a first known signal during a first period and a second period;
a voltage-controlled-oscillator analog-to-digital converter (VCO ADC) to quantize and observe an output of the DAC, wherein:
the VCO ADC comprises a voltage-to-current converter to drive a current-controlled-ring-oscillator,
the voltage-to-current converter comprises an embedded mixer, and
the embedded mixer is driven by a first quadrature phase signal during the first period and by a second quadrature phase signal during the second period; and
processing circuitry to extract a timing error of the DAC cell based on digital output of the VCO ADC generated during the first period and the second period.

11. The data converter of claim 10, wherein:
the DAC further comprises a multiplexer to provide, based on a calibration signal, the first known signal or a data signal to the DAC cell.

12. The data converter of claim 10, further comprising:
a quadrature phase signal generator to generate the first known signal, the first quadrature phase signal, and the second quadrature phase signal.

13. The data converter of claim 10, further comprising:
a first data flip-flop to receive a clock signal and an inverted output of the first data flip-flop, and generate the first known signal; and
a second data flip-flop to receive an inverted clock signal and an inverted output of the second data flip-flop, generate the first quadrature phase signal at an output of the second data flip-flop, and generate the second quadrature phase signal at an inverted output of the second data flip-flop.

14. The data converter of claim 10, wherein the processing circuitry is further to subtract a first digital output generated during the first period, from a second digital output generated during the second period.

15. A data converter with timing error calibration, comprising:
a digital-to-analog converter (DAC) comprising a DAC cell driven by a first random signal during a first period, and by a second random signal having a quadrature phase shift relative to the first random signal during a second period;
a voltage-controlled-oscillator analog-to-digital converter (VCO ADC) to quantize and observe an output of the DAC;
a mixer in a signal path between the DAC and a ring oscillator of the VCO ADC, wherein the mixer is driven by the second random signal during the first period and by the first random signal during the second period; and
processing circuitry to extract a timing error of the DAC cell based on digital output of the VCO ADC generated during the first period and the second period.

16. The data converter of claim 15, wherein:
the VCO ADC comprises a voltage-to-current converter to drive a current-controlled-ring-oscillator; and
the mixer is embedded in the voltage-to-current converter.

17. The data converter of claim 15, wherein:
the DAC further comprises a first multiplexer to provide, based on a first calibration signal, the first random signal during the first period, the second random signal during the second period, and a data signal during a third period, to the DAC cell.

18. The data converter of claim 15, further comprising:
a second multiplexer to provide, based on a second calibration signal, the second random signal during the first period, and the first random signal during the second period, to the mixer.

19. The data converter of claim 15, further comprising:
a quadrature phase signal generator to generate the first random signal and the second random signal, based on low-to-high edge transitions of a master random signal and high-to-low edge transitions of the master random signal.

20. The data converter of claim 15, further comprising:
a first data flip-flop to receive a master random signal and an inverted output of the first data flip-flop, and generate the first random signal; and
a second data flip-flop to receive an inverted master random signal and an inverted output of the second data flip-flop, generate the second random signal at an output of the second data flip-flop.

\* \* \* \* \*